United States Patent
Takewaki et al.

(10) Patent No.: US 7,888,254 B2
(45) Date of Patent: Feb. 15, 2011

(54) SEMICONDUCTOR DEVICE HAVING A REFRACTORY METAL CONTAINING FILM AND METHOD FOR MANUFACTURING THE SAME

(75) Inventors: Toshiyuki Takewaki, Kanagawa (JP); Mari Watanabe, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 177 days.

(21) Appl. No.: 12/389,634

(22) Filed: Feb. 20, 2009

(65) Prior Publication Data
US 2009/0176364 A1 Jul. 9, 2009

Related U.S. Application Data

(62) Division of application No. 11/081,505, filed on Mar. 17, 2005, now Pat. No. 7,521,802.

(30) Foreign Application Priority Data
Mar. 17, 2004 (JP) ............................ 2004-077270

(51) Int. Cl.
*H01L 21/00* (2006.01)
(52) U.S. Cl. .................. 438/597; 438/622; 438/629; 438/687; 438/725; 438/738; 257/E21.508; 257/E21.582; 257/E21.591; 257/E23.072; 257/E27.048
(58) Field of Classification Search ......... 438/597–687, 438/725–738; 257/E21.508, 577–591, 23.072, 257/149, 27.048
See application file for complete search history.

(56) References Cited

U.S. PATENT DOCUMENTS

| | | | | |
|---|---|---|---|---|
| 5,015,604 A | * | 5/1991 | Lim et al. ................... | 438/601 |
| 5,071,714 A | * | 12/1991 | Rodbell et al. .............. | 428/620 |
| 5,171,642 A | * | 12/1992 | DeHaven et al. ............. | 428/620 |
| 5,486,707 A | * | 1/1996 | Look et al. .................... | 257/52 |
| 5,943,601 A | * | 8/1999 | Usui et al. ................... | 438/688 |
| 6,248,665 B1 | * | 6/2001 | Bao et al. .................... | 438/687 |
| 6,313,517 B1 | | 11/2001 | Lautervach et al. | |
| 6,365,228 B1 | | 4/2002 | Tsai et al. | |
| 6,395,644 B1 | * | 5/2002 | Hopper et al. ............... | 438/738 |
| 6,492,257 B1 | * | 12/2002 | Shields et al. ............... | 438/622 |
| 6,737,728 B1 | * | 5/2004 | Block et al. .................. | 257/532 |
| 6,787,480 B2 | | 9/2004 | Aoki et al. | |
| 6,914,319 B2 | | 7/2005 | Okada | |
| 7,262,504 B2 | | 8/2007 | Cheng et al. | |
| 7,329,607 B2 | * | 2/2008 | Chopra et al. ............... | 438/687 |
| 7,329,955 B2 | | 2/2008 | Tsau | |
| 7,396,759 B1 | | 7/2008 | Van Schravendijk et al. | |

(Continued)

FOREIGN PATENT DOCUMENTS

JP 2001-284352 10/2001

*Primary Examiner*—Michael S Lebentritt
(74) *Attorney, Agent, or Firm*—Young & Thompson

(57) ABSTRACT

A semiconductor device and a method for manufacturing the same of the present invention in which the semiconductor device is provided with a fuse structure or an electrode pad structure, suppress the copper blowing-out from a copper containing metal film. The semiconductor device comprises a silicon substrate, $SiO_2$ film provided on the silicon substrate, copper films embedded in the $SiO_2$ film, TiN films covering an upper face of a boundary region between an upper face of copper films and the copper films, and the $SiO_2$ film, and SiON films covering an upper face of the TiN films.

7 Claims, 21 Drawing Sheets

U.S. PATENT DOCUMENTS

| | | |
|---|---|---|
| 7,435,685 B2 | 10/2008 | Deigadino et al. |
| 2003/0067077 A1 | 4/2003 | Lee |
| 2004/0041269 A1 | 3/2004 | Ohnishi |
| 2004/0046231 A1 | 3/2004 | Okada |
| 2004/0173908 A1 | 9/2004 | Barth et al. |

* cited by examiner

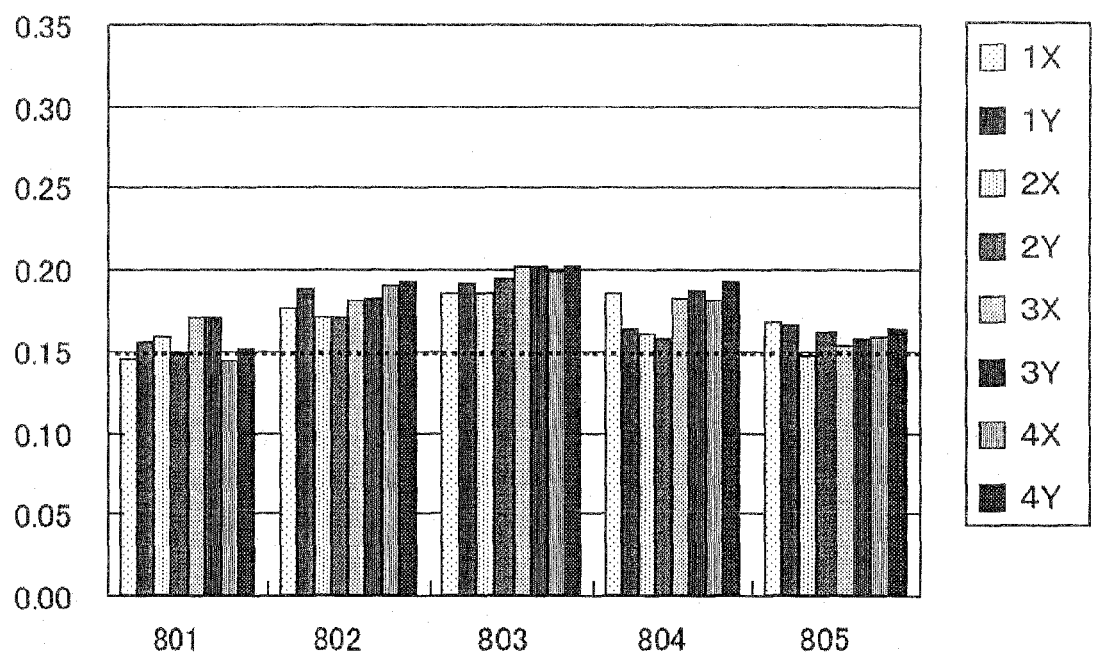

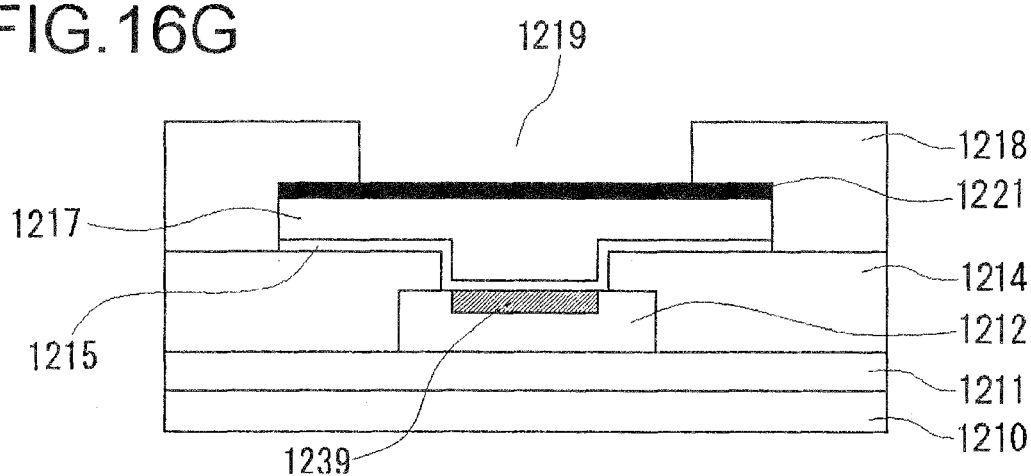
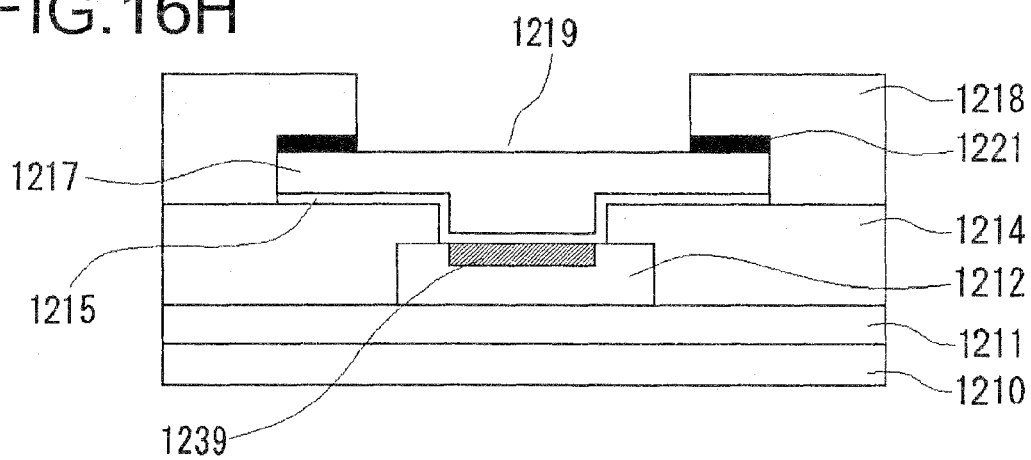
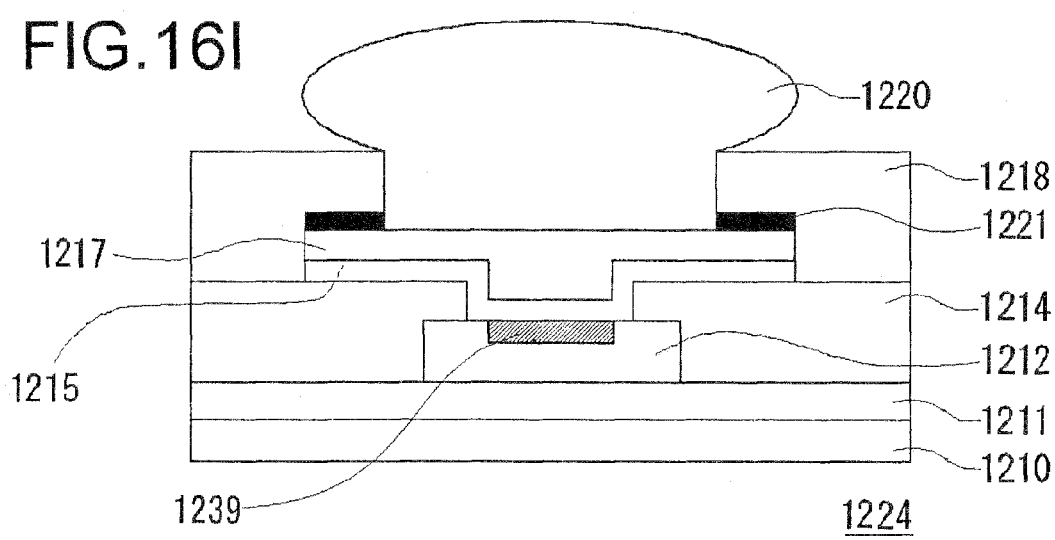

PRIOR ART

SEMICONDUCTOR DEVICE HAVING A REFRACTORY METAL CONTAINING FILM AND METHOD FOR MANUFACTURING THE SAME

This application is based on Japanese patent application NO. 2004-077270, the content of which is incorporated hereinto by reference.

BACKGROUND OF THE INVENTION

1. Field of the Invention

The present invention relates to a semiconductor device and a method for manufacturing the same.

2. Related Art

In recent years, for the purpose of realizing a highly integrated semiconductor device, a development concerning miniaturizing for a fuse structure, an interconnect structure, an electrode pad structure or the like in the semiconductor device is energetically conducted. This kind of technique is described in the Japanese Laid-Open Patent Publication No. 2001-284352.

The Japanese Laid-Open Patent Publication No. 2001-284352 describes the semiconductor device provided with a structure formed in such a way as to embed a fuse electrode, an interconnect, an electrode pad, and so forth in a recess formed in an interlayer insulating film, followed by forming a Tin film on an upper portion of them. FIG. 21 shows a sectional view of the semiconductor device described in the Japanese Laid-Open Patent Publication No. 2001-284352.

In a semiconductor device 2142, fuse electrodes 2146A, 2146B, an electrode pad 2148, interconnects 2150A, 2150B are embedded in an interlayer insulating film 2144. And, a metal film 2152 composed of such as respective TiN film and the like is provided on an upper face thereof.

Further, a cover insulating film 2154 and a polyimide film 2158 is formed on an upper face of the interlayer insulating film 2144 and on a metal film 2152 in this order.

Here, an opening 2156 penetrating a cover insulating film 2154 and a polyimide film 2158 is provided in an upper portion of the electrode pad 2148. Further, an opening 2159 penetrating the polyimide film 2158 is also provided in an upper portion of a fuse structure composed of fuse electrodes 2146A, 2146B and a metal film 2152.

In the Japanese Laid-Open Patent Publication No. 2001-284352, the effect is described that, according to such composition, further miniaturization of the semiconductor device is made to achieve, upon preventing short-circuiting between the fuse electrode, the interconnect and the electrode pad.

SUMMARY OF THE INVENTION

However, it has now been discovered that the conventional technique described in the above Japanese Laid-Open Patent Publication No. 2001-284352 has still room for improvement in the following point.

Generally, fuse electrodes 2146A, 2146B, an electrode pad 2148 and interconnects 2150A, 2150B provided on a lower portion of a metal film 2152 made of TiN or the like are composed of a copper containing metal film. And, the metal film 2152 made of TiN or the like is subjected to a patterning while employing a resist film provided on an upper portion as a mask. After this patterning, the resist film is removed using the oxygen plasma.

On this occasion, when applying plasma oxygen at the time of plasma removing of the resist film from above the metal film 2152 made of TiN film or the like, a radical oxygen infiltrates up to a copper containing metal film of an uppermost layer at a position with an insufficient coverage of the metal film 2152 made of the TiN film or the like (particularly, an interface between an interlayer insulating film and an uppermost of the copper containing metal film), so that, in some cases, the copper blowing-out, which is caused by oxidization of copper, occurs.

For this reason, when copper containing metal films, which compose the fuse electrodes 2146A, 2146B, the electrode pad 2148 and the interconnects 2150A, 2150B and the like, are in close proximity to each other, in some cases, a short circuit between the copper containing metal films occurs.

According to the present invention, there is provided a semiconductor device comprising a semiconductor substrate, a first insulating film provided on the semiconductor substrate, a copper containing metal film embedded in the first insulating film, a refractory metal containing film covering an upper portion of the copper containing metal film, and an upper portion of a boundary portion between the copper containing metal film and the first insulating film, and a second insulating film covering an upper face of the refractory metal containing film.

According to the present invention, there is provided a second insulating film covering an upper face of the refractory metal containing film, owing to this, the oxidization, which is caused by infiltration of the oxygen radical into the copper containing metal film, is suppressed, so that the copper blowing-out, which takes place caused by oxidization of the copper containing metal film, is suppressed.

According to the present invention, there is provided a semiconductor device comprising a semiconductor substrate, a first insulating film provided on the semiconductor substrate, a refractory metal containing film having a predetermined pattern provided on the first insulating film, a second insulating film provided on an upper face of the refractory metal containing film, and a third insulating film provided on the first Insulating film and the second insulating film, wherein the sum of thickness of the second insulating film on the refractory metal containing film and thickness of the third insulating film is larger than thickness of the third insulating film on the first insulating film.

According to the present invention, the sum of the second insulating film thickness on the refractory metal containing film and the third insulating film thickness is larger than the third insulating film thickness on the first insulating film, therefore, a difference of an index of reflection of the light between a region where the second insulating film resides and a region where the second insulating film does not reside increases, owing to this, alignment properties on the occasion of a redundancy process are improved.

According to the present invention, there is provided a semiconductor device comprising a semiconductor substrate, a first insulating film provided on the semiconductor substrate, a first insulating film provided on the semiconductor substrate, a refractory metal containing film having a predetermined pattern provided on the first insulating film, and a second insulating film provided on the first insulating film and the refractory metal containing film, wherein a thickness of the second insulating film on the refractory metal containing film is larger than a thickness of the second insulating film on the first insulating film.

According to the present invention, a thickness of the second insulating film on the refractory metal containing film is larger than a thickness of the second insulating film on the first insulating film, therefore, a difference of an index of reflection of the light between a region where the refractory metal containing film resides and a region where the refractory metal containing film does not reside increases, owing to this, alignment property is improved.

According to the present invention, there is provided a method for manufacturing a semiconductor device comprising: forming a first insulating film on a semiconductor substrate, embedding a copper containing metal film in the first insulating film, forming a refractory metal containing film covering an upper face of the first insulating film and an upper face of the copper containing metal film, forming a second insulating film covering an upper face of the refractory metal containing film, forming a resist film on an upper face of the second insulating film, etching selectively the second insulating film and the refractory metal containing film while employing the resist film as a mask, and carrying out a patterning into a shape to cover an upper portion of the copper containing metal film and an upper portion of a boundary portion between the copper containing metal film and the first insulating film, and removing the resist film while employing an oxygen plasma.

According to the present invention, since including forming the second insulating film covering the upper face of the refractory metal containing film, the oxidization, which is caused by infiltration of the oxygen radical into copper containing metal film, is suppressed, so that the copper blowing-out, which is caused by the oxidization of the copper containing metal film, is suppressed.

According to the present invention, there is provided a method for manufacturing a semiconductor device comprising: forming a first insulating film on a semiconductor substrate, embedding a copper containing metal film in the first insulating film, forming a refractory metal containing film covering an upper face of the first insulating film and an upper face of the copper containing metal film, forming a second insulating film covering an upper face of the refractory metal containing film, and forming a resist film on an upper face of the second insulating film, etching selectively the second insulating film while employing the resist film as a mask, removing the resist film while employing an oxygen plasma, etching selectively the refractory metal containing film while employing the second insulating film as a mask, and carrying out a patterning into a shape to cover an upper portion of the copper containing metal film and an upper portion of a boundary portion between the copper containing metal film and the first insulating film in connection with the second insulating film and the refractory metal containing film.

According to the present invention, the method includes forming the second insulating film covering an upper face of the refractory metal containing film, therefore, in the removing the resist film upon employing the oxygen plasma, a diffusion of the radical oxygen is suppressed by the second insulating film, so that the copper blowing-out, which is caused by an oxidization of the copper containing metal film, is suppressed.

According to the present invention, there is provided a method for manufacturing a semiconductor device comprising: forming a first insulating film on a semiconductor substrate, embedding a copper containing metal film in the first insulating film, forming a refractory metal containing film covering an upper face of the first insulating film and an upper face of the copper containing metal film, forming a second insulating film covering an upper face of the refractory metal containing film, forming a resist film on an upper face of the second insulating film, etching selectively the second insulating film and the refractory metal containing film while employing the resist film as a mask, and carrying out a patterning into a shape to cover an upper portion of the copper containing metal film and an upper portion of a boundary portion between the copper containing metal film and the first insulating film, removing the resist film while employing an oxygen plasma, removing the second insulating film, and forming an electrode pad on an upper face of the refractory metal containing film.

According to the present invention, the method includes forming the second insulating film covering an upper face of the refractory metal containing film, therefore, in the step of removing the resist film upon employing the oxygen plasma, a diffusion of the radical oxygen is suppressed by the second insulating film, so that a decrease of contact property between the copper containing metal film and the refractory metal film is suppressed.

According to the present invention, there is provided the second insulating film covering an upper face of the refractory metal containing film, therefore, the copper blowing-out, which is caused by an oxidization of the copper containing metal film, is suppressed. Further, the thickness of the insulating film covering an upper face of the refractory metal containing film is large, owing to this, alignment property is improved.

BRIEF DESCRIPTION OF THE DRAWINGS

The above and other objects, advantages and features of the present invention will be more apparent from the following description taken in conjunction with the accompanying drawings, in which:

FIGS. 8C to 8J are process sectional views schematically showing a method for manufacturing the electrode pad structure according to the second embodiment;

FIG. 10 is a graphical representation showing a contrast evaluation result of the alignment mark according to a third embodiment;

FIGS. 16G to 16I are process sectional views schematically showing a method for manufacturing the electrode pad structure according to the second comparison example;

DETAILED DESCRIPTION OF THE INVENTION

Figure 1:
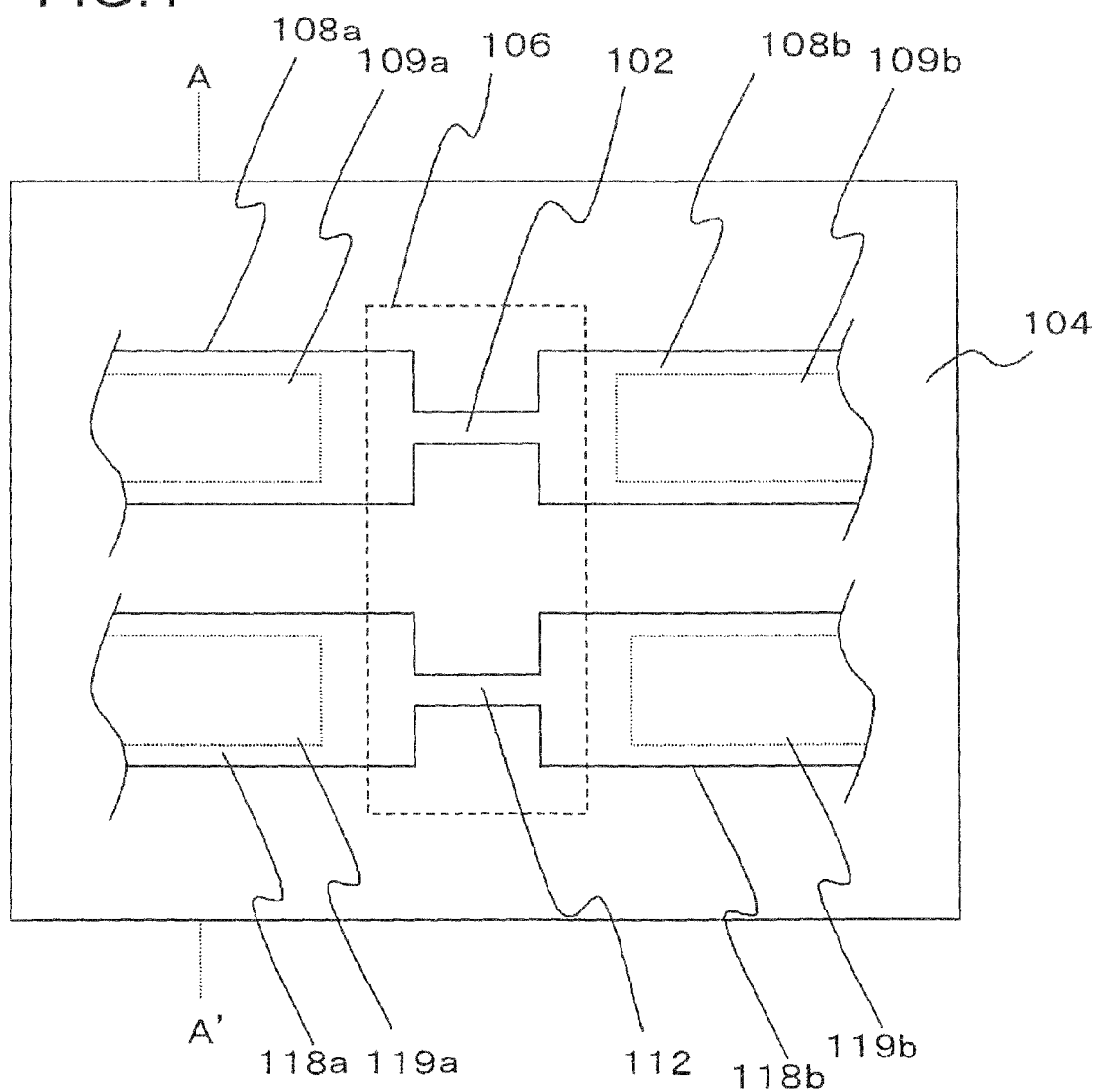
FIG. 1 is a plan view schematically showing a fuse structure according to a first embodiment.

The invention will now be described herein with reference to illustrative embodiments. Those skilled in the art will recognize that many alternative embodiments can be accomplished using the teachings of the present invention and that the invention is not limited to the embodiments illustrated for explanatory purposed.

In the semiconductor device provided by the present invention, the above-described second insulating film may be a film including a silicon nitride film, a silicon oxide film or a silicon oxynitride film. According to the configuration, the second insulating film is an insulating film made of material through which oxygen plasma is hard to pass, therefore, it is suppressed that the radical oxygen infiltrates into the copper containing metal film to cause the oxidization, so that the copper blowing-out, which is caused by oxidization of the copper containing metal film, is suppressed. Further, according to the configuration, alignment property is further improved by the reason that the difference of the index of reflection of light is made large between a region where the second insulating film resides and a region where the second insulating film does not reside.

The refractory metal containing film may be a film made of material including not less than one kind selected from a group composed of Ti, TiN, Ta, TaN, W, MO, Cr and Ni. According to the configuration, it is possible to use the above described refractory metal containing film as a fuse wiring on the fuse electrode, a barrier metal film on the electrode pad and cap metal film on the interconnect. Further, according to the configuration, an alignment property is further improved by the reason that the difference of the index of reflection of light is made large between a region where the refractory metal containing film resides and a region where the refractory metal containing film does not reside.

The second insulating film may be constituted that the film thickness is not less than 0.01 μm and not more than 1.0 μm. According to this configuration, the second insulating film is capable of suppressing infiltrating of oxygen plasma, so that the copper blowing-out, which is caused by oxidization of the copper containing metal film, is suppressed.

The refractory metal containing film may be constituted that the film thickness is not less than 0.1 μm and not more than 0.3 μm. According to the configuration, it is possible to employ the refractory metal containing film as the fuse wiring on the fuse electrode, the barrier metal film on the electrode pad and a cap metal film on the interconnect.

The semiconductor device provided by the present invention may comprise a third insulating film provided on the first insulating film and on the second insulating film. According to the configuration, it is possible to protect the semiconductor device with the third insulating film.

The third insulating film may be a film including the silicon nitride film, the silicon oxide film or the silicon oxynitride film. According to the configuration, it is possible to further effectively protect the semiconductor device with the third insulating film.

The refractory metal containing film may be the fuse wiring, and the copper containing metal film may be the fuse electrode. According to the configuration, it is possible to suppress the copper blowing-out from the fuse electrode.

The method for manufacturing the semiconductor device may be provided with a step of forming solder balls on an upper face of the electrode pad. According to the method, it is possible to provide a BGA structure with excellent contact property.

The step of forming the second insulating film may include a step of forming the second insulating film by using the plasma method or the CVD method. According to the method, a crystal structure of the second insulating film becomes dense, therefore, the second insulating film is capable of more effectively suppressing infiltrating the oxygen plasma, owing to this, the copper blowing-out, which is caused by the copper containing metal film oxidization, is further suppressed.

Embodiment

Hereinafter, there will be further described the present invention based on embodiments, however, the present invention is not limited by these embodiments.

First Embodiment

FIG. 1 is a plan view schematically showing a fuse structure according to the present embodiment. It should be noted that, in FIG. 1, part of members are not shown for convenience of description.

In the fuse structure according to the present embodiment, fuse wirings 108a, 108b, 118a and 118b are provided on an upper face of an insulating film 104, which is provided on an upper portion of a semiconductor substrate (not shown in the drawings). The fuse wiring 108a and the fuse wiring 108b are connected to a fuse 102. Likewise, the fuse wiring 118a and the fuse wiring 118b are connected to a fuse 112.

On the lower portion of the fuse wirings 108a, 108b, 118a and 118b, the fuse electrodes 109a, 109b, 119a and 119b are provided respectively. In FIG. 1, a laser irradiating region 106 is a region enclosing the fuse 102 and the fuse 112.

In the case that semiconductor elements (not shown in the drawings) connected to the fuse electrodes 109a, 109b, 119a and 119b and the like are defective, the fuse is disconnected by applying a laser light to the corresponding the fuse 102 or the fuse 112.

Figure 2:
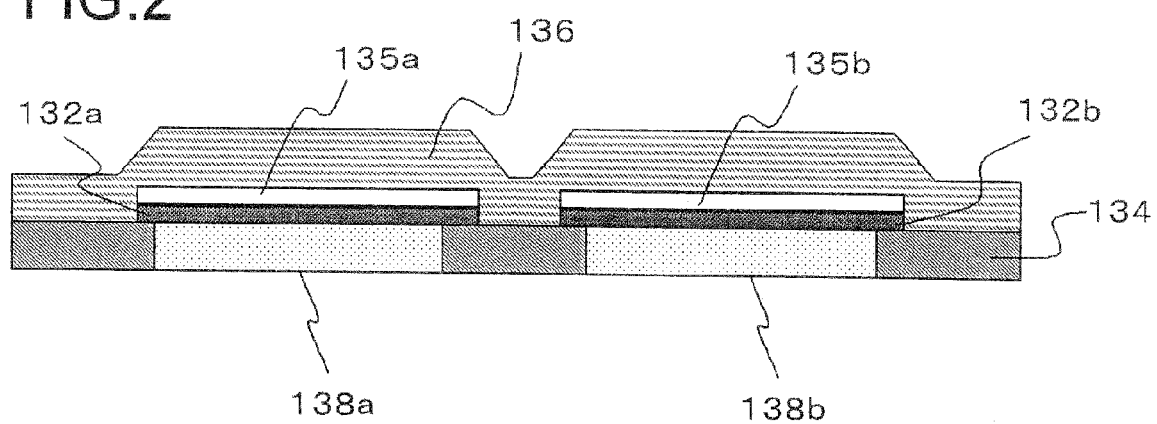
FIG. 2 is a sectional view schematically showing the fuse structure according to the first embodiment.

FIG. 2 is a sectional view schematically showing A-A' sectional view of the fuse structure according to the embodiment shown in FIG. 1.

On an upper portion of the semiconductor substrate (not shown in the drawings), a $SiO_2$ film 134 is provided. In the $SiO_2$ film 134, copper films 138a, 138b are embedded. TiN films 132a, 132b are provided on an upper face of copper films 138a, 138b, and on an upper face of a boundary portion region between the copper films 138a, 138b and the $SiO_2$ film 134.

On an upper face of the TiN films 132a, 132b, SiON films 135a, 135b are provided. Further, on an upper face of the $SiO_2$ film 134 and the SiON films 135a, 135b, a SiON film 136 is also provided.

According to the configuration, since there is provided the SiON films 135a, 135b covering an upper face of the TiN films 132a, 132b, as described later, on the occasion of removing the resist film on the upper face of the SiON films 135a, 135b while using the oxygen plasma, a diffusion of the radical oxygen for a copper film is suppressed by the SiON films 135a, 135b, so that the copper blowing-out, which is caused by oxidization of the copper films 138a, 138b, is suppressed.

Here, it is preferable that the film thickness of the TiN films 132a, 132b is made to be, for instance, not less than 0.1 μm and not more than 0.3 μm. According to the configuration, it is possible to preferably use the TiN films 132a, 132b as the fuse wiring.

Further, it is preferable that the film thickness of the SiON films 135a, 135b, is made to be, for instance, not less than 0.01 μm and not more than 1.0 μm. According to the composition, the SiON films 135a, 135b can suppress infiltrating of the oxygen plasma, therefore, the copper blowing-out, which is caused by oxidization of the copper films 138a, 138b, is suppressed.

Here, in the present embodiment, TiN films 132a, 132b are used as the refractory metal containing film, however, it is not particularly limited to this matter. For instance, the refractory metal containing film may be a film, which is made of materials including not less than one kind selected from a group composed of Ti, Ta, TaN, W, Mo, Cr and Ni other than the TiN films 132a, 132b. According to the composition, it is possible to preferably employ the refractory metal containing film as a fuse wiring on the fuse electrode.

Further, in the present embodiment, the SiON films 135a, 135b to be a silicon oxynitride is employed as the second insulating film, however, it is not limited specially to this matter. For instance, the second insulating film may be a film made of materials including silicon nitride such as SiN and the like or silicon oxide such as $SiO_2$ and the like other than the SiON films 135a, 135b. According to the configuration, the second insulating film is an insulating film made of material, which makes the oxygen plasma hardly infiltrate, therefore, as described later, when removing the resist film on an upper face of the second insulating film, a diffusion of the radical oxygen is suppressed by the second insulating film, the copper blowing-out, which is caused by oxidization of the copper films 138a, 138b, is suppressed.

Further, in the present embodiment, there may be further provided a SiON film 136, which is provided on the $SiO_2$ film 134 and the SiON films 135a, 135b. According to the composition, it is possible to protect the copper films 138a, 138b, the TiN films 132a, 132b, the SiON films 135a, 135b or the like with the SiON film 136.

Further, in the present embodiment, the SiON film 136 to be the silicon oxynitride is employed as a third insulating film, however it is not limited specially to the matter. For instance, the third insulating film may be a film made of material including the silicon nitride such as SiN and the like or the silicon oxide such as $SiO_2$ and the like other than the SiON film 136. According to the configuration, it is possible to effectively protect the copper films 138a, 138b, the TiN films 132a, 132b and the SiON films 135a, 135b and the like with the third insulating film.

It should be noted that, in the present embodiment, the TiN films 132a, 132b are employed as the fuse wirings and the copper films 138a, 138b are employed as the fuse electrodes, however, it is not specially limited to the matter. For instance, the TiN films 132a, 132b may be employed as a barrier film, and the copper films 138a, 138b may be employed as an electrode pad. According to the configuration, it is possible to suppress the copper blowing-out from the electrode pad. In another case, the TiN films 132a, 132b may be employed as a cap metal film, and the copper films 138a, 138b may be employed as interconnects. According to the configuration, it is possible to suppress the copper blowing-out from the interconnect.

Next, there will be described a method for manufacturing the fuse structure according to the present embodiment. FIGS. 3A to 3C and 4D to 4F are process sectional views schematically showing a method for manufacturing the fuse structure according to the embodiment.

Figure 3A:
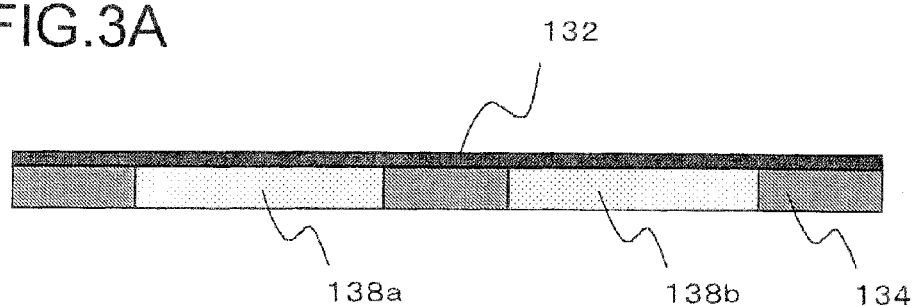
FIGS. 3A to 3C are process sectional views schematically showing a method for manufacturing the fuse structure according to the first embodiment.

As shown in FIG. 3A, in order to manufacture the fuse structure of the present embodiment, first, the $SiO_2$ film 134 is provided on an upper portion of the semiconductor substrate (not shown in the drawings). Next, there is provided a recess portion in the $SiO_2$ film 134, followed by embedding the copper films 138a, 138b on the inner portion of the recess. In embedding of the copper film, for flattening, CMP (Chemical Mechanical Polish) is employed. Further, the TiN film 132 is formed on an upper face of the $SiO_2$ film 134 and on upper faces of the copper films 138a, 138b.

Figure 3B:
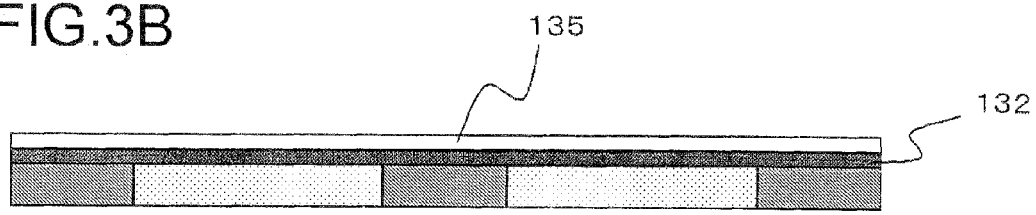

Next, as shown in FIG. 3B, the SiON film 135 is formed on an upper face of the TiN film 132. For instance, the SiON film 135 is formed by a plasma technique or a CVD technique. According to the method, a crystal structure of the SiON film 135 becomes dense, therefore, as described later, the SiON film 135 is capable of more effectively suppressing infiltrating the oxygen plasma, owing to this, the copper blowing-out, which is caused by the oxidization of the copper films 138a, 138b, is further suppressed.

Figure 3C:
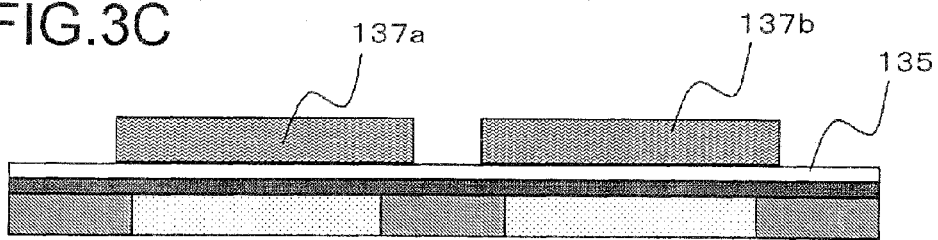

Successively, as shown in FIG. 3C, photoresist films 137a, 137b with predetermined pattern are formed on an upper face of the SiON film. Usually, the predetermined pattern is capable of covering a region of the copper films 138a, 138b with a margin.

Figure 4D:
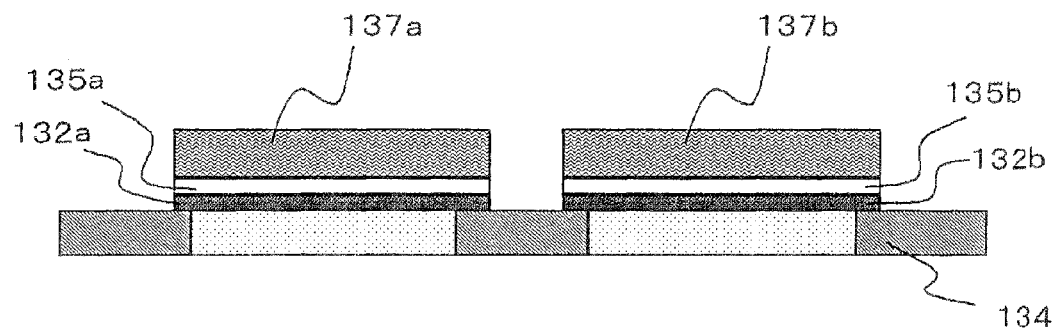
FIGS. 4D to 4F are process sectional views schematically showing a method for manufacturing the fuse structure according to the first embodiment.

And, as shown in FIG. 4D, the respective TiN films 132a, 132b and the SiON films 135a, 135b are formed by patterning into a shape covering an upper portion of the copper films 138a, 138b and an upper portion of a boundary region between the copper films 138a, 138b and the $SiO_2$ film 134, by means of etching of the SiON film 135 and the TiN film 132, using a gas including $Cl_2$ and $BCl_3$ as an etching gas with photoresist films 137a, 137b as masks.

Figure 4E:
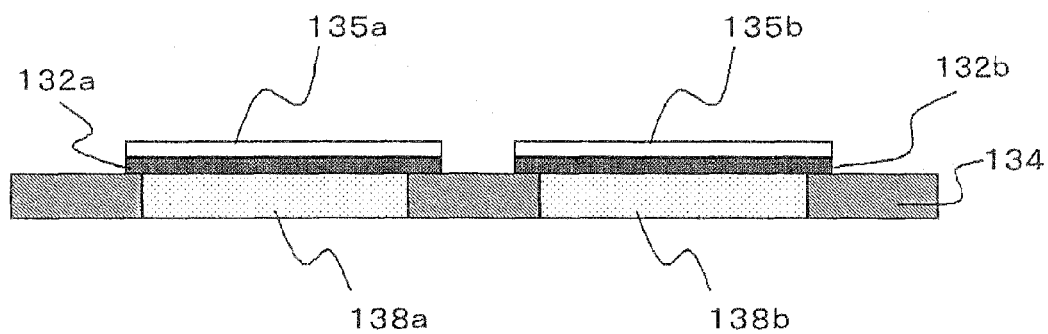

Next, as shown in FIG. 4E, the photoresist films 137a, 137b is removed while employing the oxygen plasma as an ashing gas.

At this time, since the SiON films 135a, 135b covering the upper face of the TiN films 132a, 132b reside, in a process removing photoresist films 137a, 137b while employing the oxygen plasma, the diffusion of the radical oxygen is suppressed by the SiON films 135a, 135b, so that the copper blowing-out, which is caused by the oxidization of the copper films 138a, 138b, is suppressed.

Figure 4F:
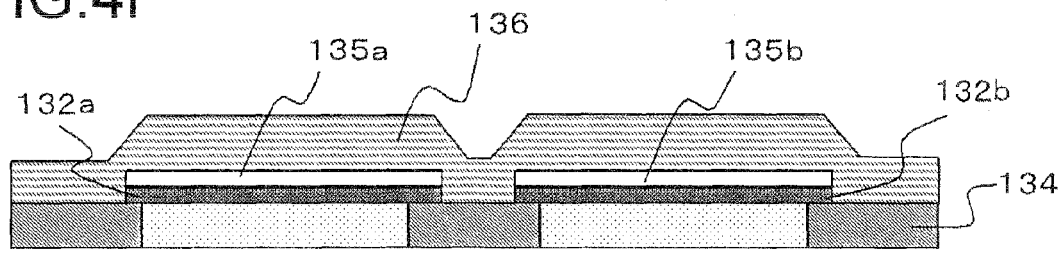

Successively, as shown in FIG. 4F, the fuse structure described in the embodiment illustrated in the above FIG. 2 is obtained, while forming the SiON film 136 on an upper portion of the SiO₂ film 134 and the SiON films 135a, 135b.

According to the manufacturing method of the present embodiment, the semiconductor device provided with the fuse electrode composed of the copper films 138a, 138b and the like having the fuse wiring composed of the TiN films 132a, 132b and the like on an upper face is obtained. At this time, the TiN films 132a, 132b are formed on an uppermost layer of the copper films 138a, 138b, after that, the insulating film such as the SiON films 135a, 135b or the like are formed, thus, the fuse wiring composed of the TiN films 132a, 132b or the like is formed with those SiON films 135a, 135b as a hard mask. Thereafter, the SiON film 136 is formed as a protecting film.

In a structure without providing the SiON films 135a, 135b, when carrying out the ashing under atmosphere of the oxygen plasma on the occasion of plasma removing of the photoresist films 137a, 137b, the radical oxygen infiltrates up to the uppermost layer of the copper films 138a, 138b at a position with insufficient coverage (particularly, an interface between the SiO₂ film 134 and the uppermost layer of the copper films 138a, 138b) of the TiN films 132a, 132b, so that, in some cases, the copper blowing-out, which is caused by oxidization of the copper films 138a, 138b, may occur. A poor coverage of the TiN film at the interface between the SiO₂ film 134 and the uppermost layer of the copper films 138a, 138b is caused by the fact that the recess of the copper film is generated by the CMP, carried out on the occasion of flattening of copper film embedding.

On the other hand, according to the manufacturing method of the present embodiment, it is possible to stably manufacture the semiconductor device provided with a configuration capable of suppressing oxidization of the copper films 138a, 138b and further also suppressing the copper blowing-out caused by the fact that the diffusion of the radical oxygen is suppressed with the SiON films 135a, 135b to be the hard mask.

For this reason, according to the manufacturing method, on the occasion of etching of the TiN films 132a, 132b, it is possible to suppress the copper blowing-out caused by oxidization of the copper films 138a, 138b provided under the fuse wiring composed of the TiN films 132a, 132b, so that it is possible to stably manufacture the semiconductor device provided with a configuration capable of preventing an electrical short between fuse wirings composed of the TiN films 132a, 132b in proximity to each other.

It should be noted that, in the present embodiment, the patterning of the TiN film 132 and the SiON film 135 is carried out with one-step etching, however, it is not limited especially to the matter. For instance, the patterning of the TiN film 132 and the SiON film 135 may be carried out with two-step etching instead of the patterning of the TiN film 132 and the SiON film 135 be carried out with one-step etching.

In the case of carrying out etching of this two-step, although it is not shown in the drawing, first, with the photoresist films 137a, 137b as a mask, the SiON film 135 is made to carry out patterning by the etching with etching gas including SF₆, CH₂H₂ and N₂, by this means, the SiON films 135a, 135b are formed. Next, the photoresist films 137a, 137b is removed while employing the oxygen plasma as the ashing gas. Successively, with the SiON films 135a, 135b as a mask, the TiN film 132 is made to carry out patterning by the etching with etching gas including Cl₂ and BCl₂, by this means, the TiN films 132a, 132b are formed.

In the case of carrying out the two-step etching, on the occasion of removing the photoresist films 137a, 137b, while employing the oxygen plasma as the ashing gas, the TiN film 132 is not carried out patterning yet, therefore, it is further suppressed that the radical oxygen infiltrates into the copper films 138a, 138b. For that reason, there is an advantage that the copper blowing-out is further suppressed.

On the other hand, when carrying out the one-step etching, it is possible to reduce the number of process, owing to this, there are advantages that a manufacturing cost is made to decrease, and it is possible to improve productivity.

Figure 19:
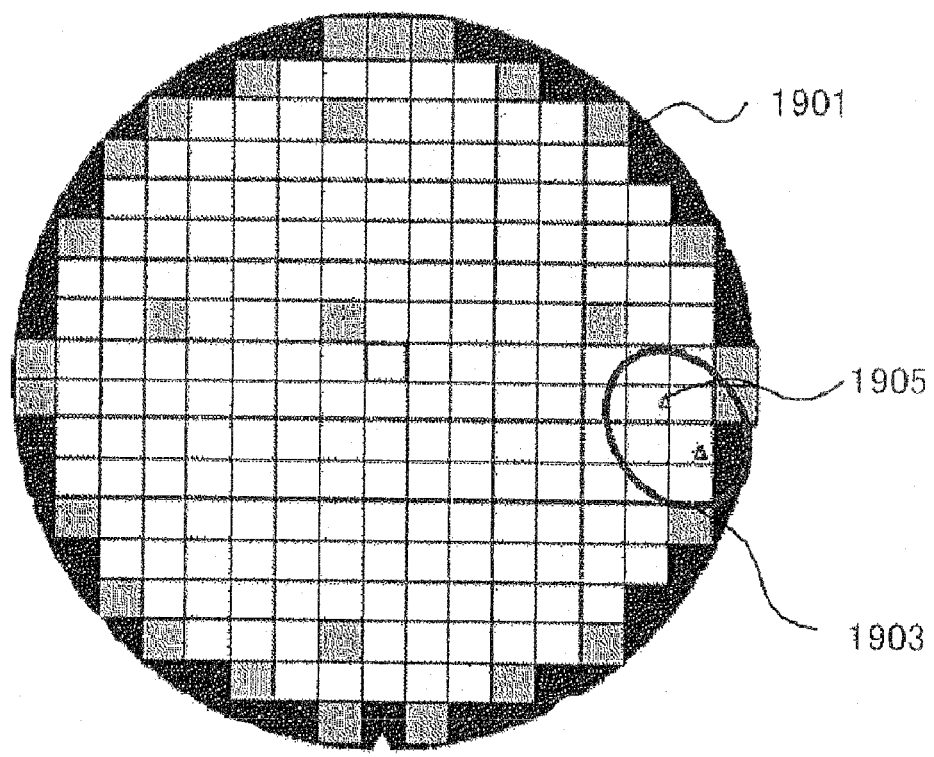
FIG. 19 is a plan view showing an evaluation result of condition of the copper blowing-out in a semiconductor chip provided with the fuse structure according to the first embodiment.

FIG. 19 is a plan view showing an evaluation result of condition of the copper blowing-out in a semiconductor chip provided with the fuse structure according to the present embodiment.

As shown in FIG. 19, in a semiconductor wafer 1901 mounted with the semiconductor chip provided with the fuse structure according to the present embodiment, only very few copper blowing-out 1905 is observed in the limited copper blowing-out generating region 1903.

FIRST COMPARISON EXAMPLE

FIGS. 20A, 20B, 20C and 20D are plan views and enlarged views respectively showing an evaluation result of condition of the copper blowing-out in the semiconductor chip provided with the fuse structure according to the present comparison example described later.

Figure 20A:
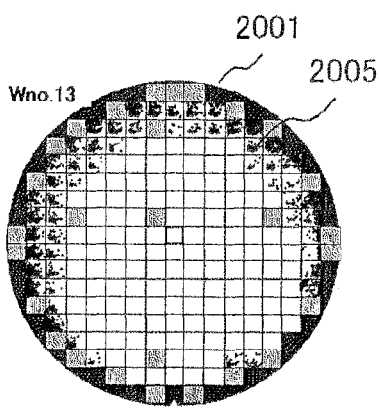
FIGS. 20A to 20D are a plan view and an enlarged view showing an evaluation result of condition of the copper blowing-out in a semiconductor chip provided with the fuse structure according to the first comparison example.
Figure 20B:
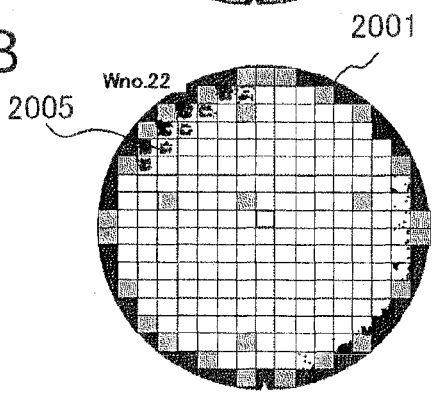

The present inventor has prepared to evaluate the fuse structure provided with structure without providing a hard cover film composed of SiON film described above on the fuse wiring composed of the TiN film as follows:

As shown in FIGS. 20A and 20B, in the semiconductor wafer 2001 (Wno.13 and Wno.22) mounted with the semiconductor chip provided with the fuse structure according to the present comparison example described later, a large number of copper blowing-out 2005 are observed.

Figure 20C:
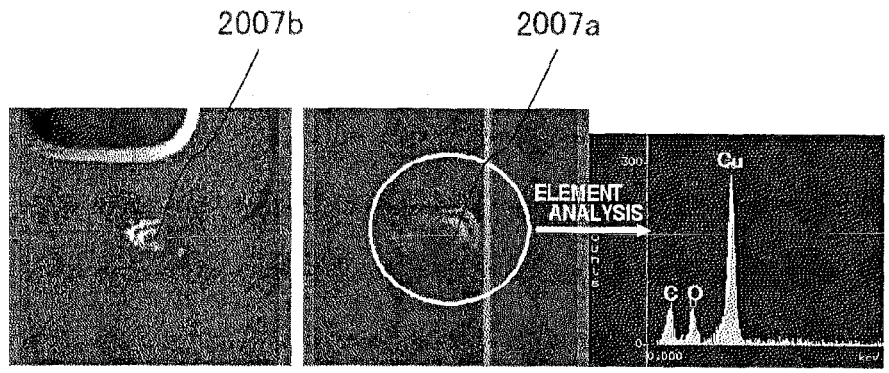
Figure 20D:
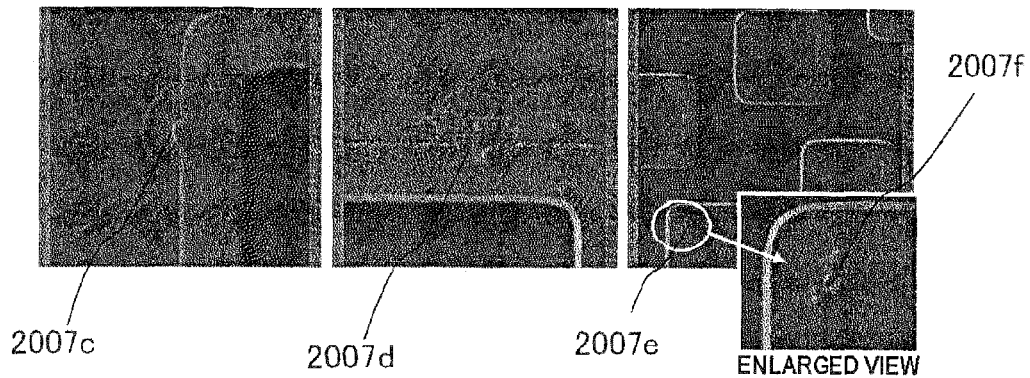
Figure 21:
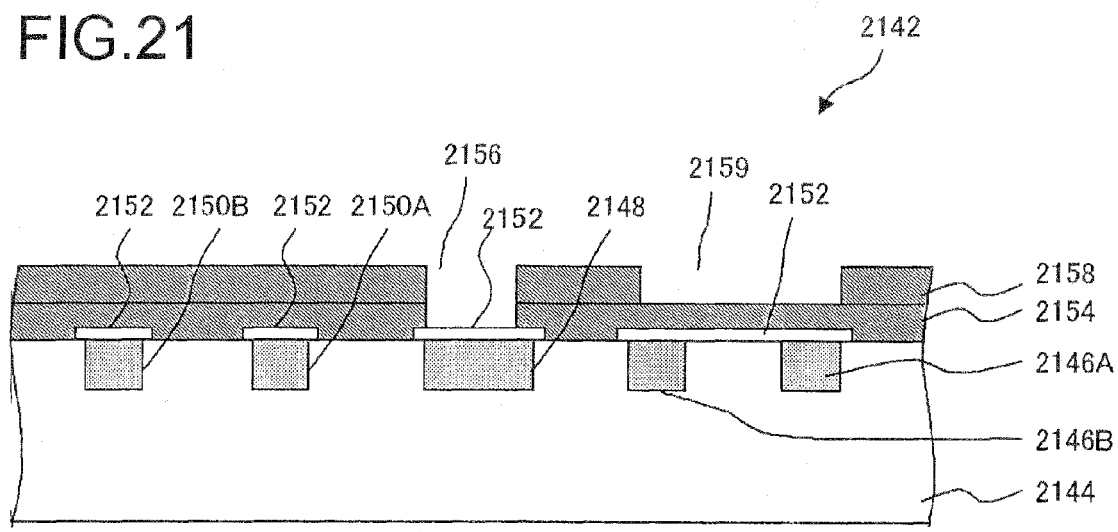
FIG. 21 is a sectional view schematically showing the semiconductor device provided with the conventional fuse structure.

FIGS. 20C and 20D are an enlarged observed view in the vicinity of the copper blowing-out 2005. As shown in FIGS. 20C and 20D, a large number of the copper blowing-out 2007a, 2007b, 2007c, 2007d, 2007e and the like are observed from end portions of the fuse structure, the electrode pad structure or the interconnect structure. It should be noted that a copper blowing-out 2007f corresponds to an enlarged observed view of the copper blowing-out 2007e in FIG. 20D.

When carrying out an elemental analysis of the copper blowing-out 2007a, as shown in FIG. 20C, a peak of copper and oxygen is obtained, so that it has become clear that matter blowing out is a copper oxide.

The inventor has discovered that, based on the experimental data, through pursuing a cause of the copper blowing-out, in some cases, the copper blowing-out takes place in the following manufacturing process.

FIGS. 11A to 11C and FIGS. 12D and 12E are process sectional views schematically showing a method for manufacturing the fuse structure according to the present comparison example.

Figure 11A:
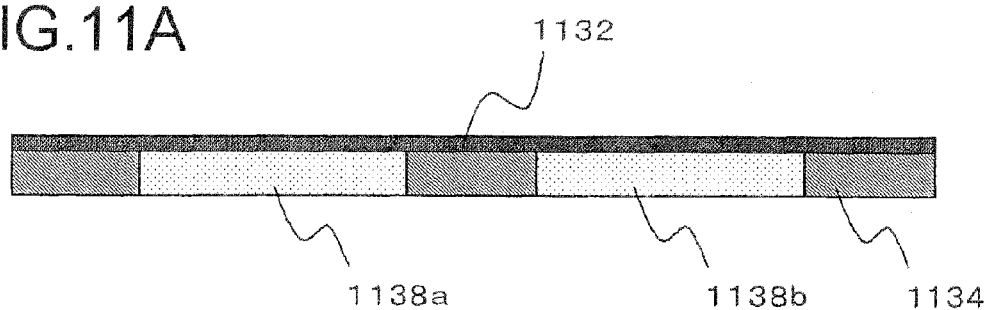
FIGS. 11A to 11C are process sectional views schematically showing a method for manufacturing the fuse structure according to a first comparison example.

In the manufacturing method of the present comparison example, first, as shown in FIG. 11A, a SiO₂ film 1134 is formed on the semiconductor substrate (not shown in the drawings). Subsequently, a recess is formed on an upper face of the SiO₂ film 134 and copper films 1138a, 1138b are formed within the recess. Successively, a structure shown in FIG. 11A is obtained while forming the TiN film 1132 on the upper face of the SiO₂ film 1134 and on the upper face of the copper films 1138a, 1138b.

Figure 11B:
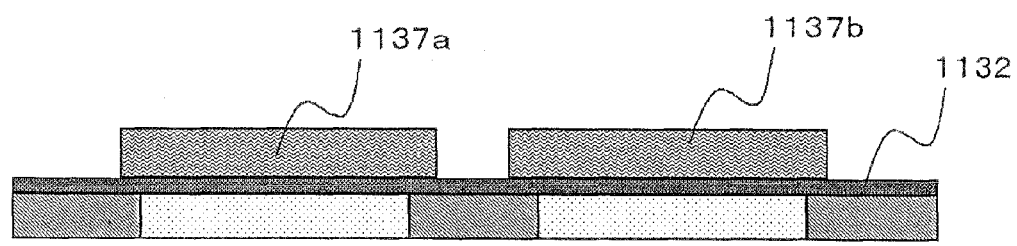

Next, as shown in FIG. 11B, photoresist films 1137a, 1137b with predetermined pattern are formed on the TiN film 1132.

Figure 11C:
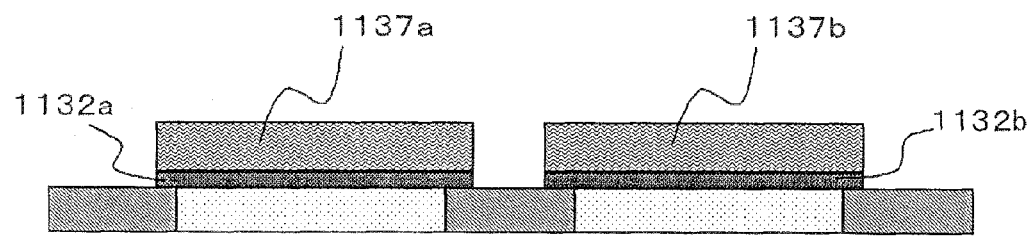

Successively, as shown in FIG. 11C, TiN films 1132a, 1132b are made to carry out patterning with a method such as etching or the like, while employing photoresist film 1137a, 1137b as a mask.

Figure 12D:
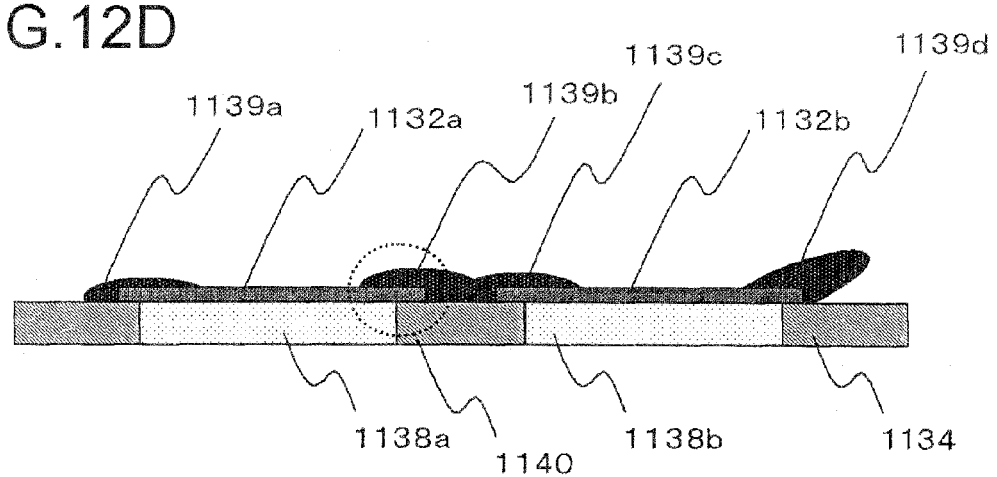
FIGS. 12D to 12E are process sectional views schematically showing a method for manufacturing the fuse structure according to the first comparison example.

Next, as shown in FIG. 12D, the photoresist films 1137a, 1137b are removed, while employing the oxygen plasma or the like as etching gas.

Figure 12E:
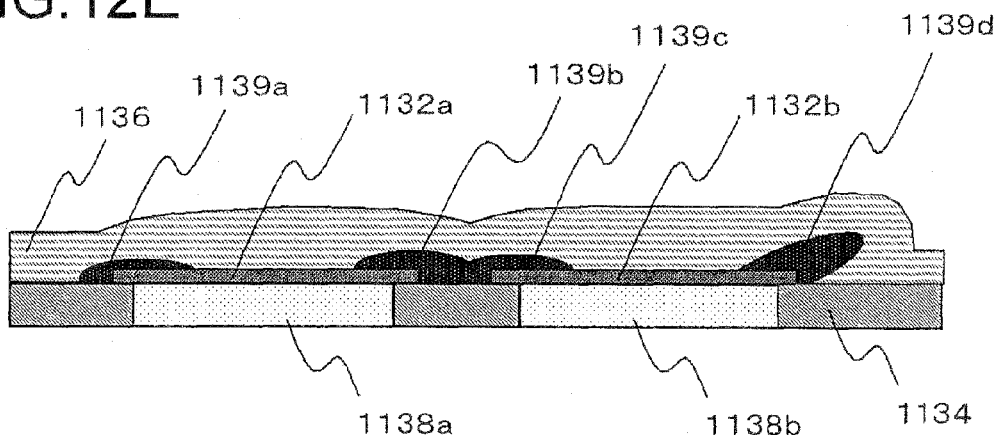

And, as shown in FIG. 12E, a SiON film 1136 is formed in such a way as to coat the SiO$_2$ films 1134a, 1134b and the TiN film 1132.

In the above manufacturing process, on the occasion of plasma removing of the photoresist films 1137a, 1137b, the oxygen plasma is applied as etching gas from above the Tin films 1132a, 1132b to be the fuse film.

For that reason, as shown in FIG. 12D, the radical oxygen infiltrates up to the copper films 1138a, 1138b of the uppermost layer at the position with insufficient coverage of the TiN films 1132a, 1132b, a plurality of the copper blowing-out 1139a, 1139b, 1139c, and 1139d is caused by the oxidization of the copper.

Figure 13:
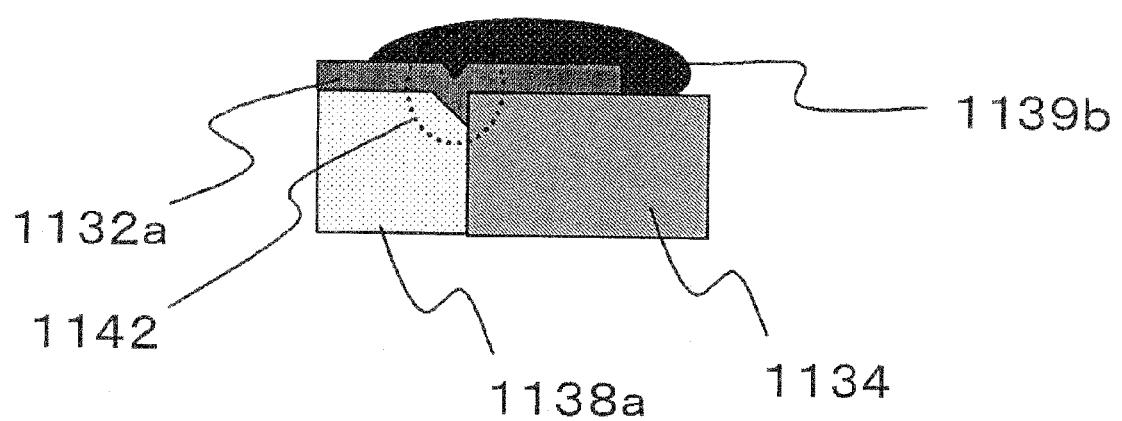
FIG. 13 is an enlarged sectional view schematically showing state of the copper blowing-out of an electrode end portion in a method for manufacturing the fuse structure according to the first comparison example.

FIG. 13 is an enlarged sectional view schematically showing the copper blowing-out of an end of the electrode in a method for manufacturing the fuse electrode according to the present comparative example. Specifically, it corresponds to an enlarged sectional view of periphery of a copper blowing-out portion 1140 shown in FIG. 12D.

In the present comparison example, different from the case of the embodiment, since there is no hard cover film made of SiON or the like on the TiN films 1132a, 1132b, on the occasion of the plasma removing of the photoresist films 1137a, 1137b, owing to this, the copper blowing-out 1139b takes place specially in circumference of a side slit generating portion 1142 in the vicinity of an interface between the SiO$_2$ film 1134 to be an interlayer insulating film and the copper films 1138a, 1138b to be the copper interconnect of the uppermost layer. In the vicinity of the side slit generating portion 1142, since coverage of the TiN films 1132a, 1132b is defective, the oxygen plasma is easy to infiltrate.

Further, the TiN films 1132a, 1132b are made of materials in which the oxygen plasma is relatively easy to infiltrate, therefore, in also other than those portions, it contributes to generating of copper oxidization. As a result, the volume of the copper films 1138a, 1138b is expanded, therefore, a copper blowing-out 1139b is easy to take place from periphery of the interface where a slit is liable to be formed.

And, according to the above-described mechanism, in the case that a distance between the fuse electrodes is near, it contributes to an occurrence of electrical short between fuse electrodes as shown in a state between a copper blowing-out 1139b and a copper blowing-out 1139c.

Second Embodiment

Figure 5:
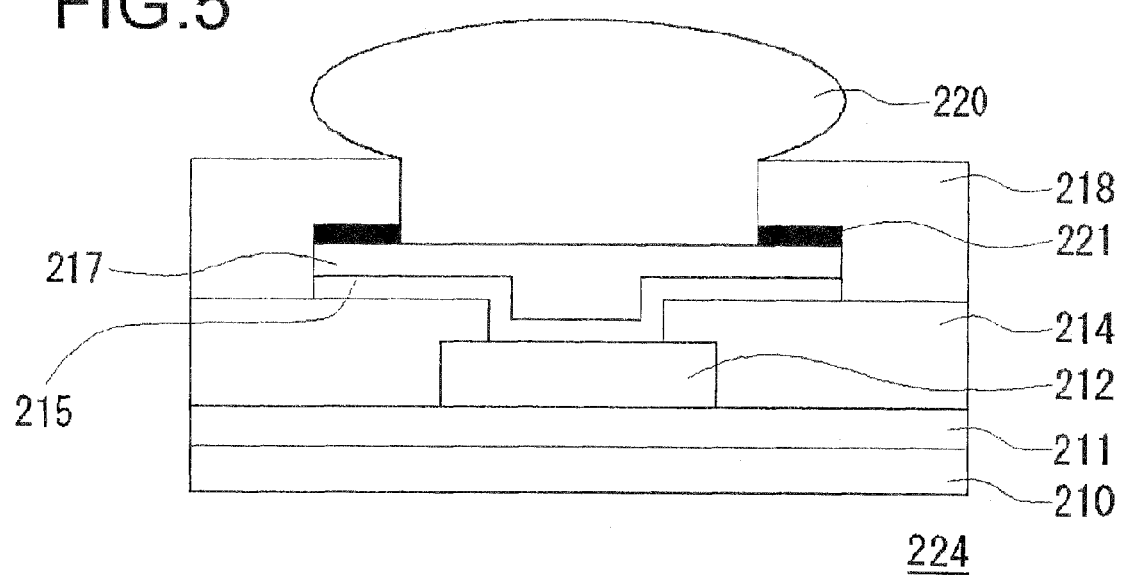
FIG. 5 is a sectional view schematically showing an electrode pad structure according to a second embodiment.

FIG. 5 is a sectional view schematically showing an electrode pad structure according to the present embodiment.

An electrode pad structure 224 of the present embodiment is provided with a multilayer film 211 on a silicon substrate 210. An interlayer insulating film 214 is provided on an upper face of the multilayer film 211. And, a copper interconnect 212 is embedded within the interlayer insulating film 214. A TiN film 215 is provided on an upper face of the copper interconnect 212 and on an upper face of the interlayer insulating film 214. A pad metal film 217 is provided on the upper face of the TiN film 215.

A TiN film 221 is provided on an upper face of the pad metal film 217. An opening is provided on portion of the TiN film 221; in the opening, an upper face of the pad metal film 217 is connected to a solder ball 220. Further, a polyimide film 218 covering a multilayered film of the TiN film 215, the pad metal film 217 and the TiN film 221, and covering a side face of part of the solder ball 220 are provided on the interlayer insulating film 214.

FIGS. 6A to 6C, 7D to 7F and 8G to 8J are process sectional views schematically showing the electrode pad structure according to the present embodiment.

Next, there will be described a method for manufacturing the electrode pad of the present embodiment.

Figure 6A:
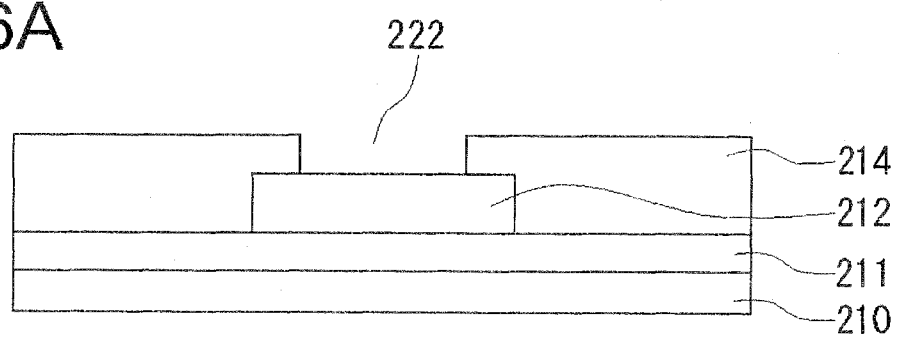
FIGS. 6A to 6C are process sectional views schematically showing a method for manufacturing the electrode pad structure according to the second embodiment.

As shown in FIG. 6A, in order to manufacture the electrode pad structure of the present embodiment, first, a multilayered film 211 composed of a multilayer interconnect structure or the like is formed on a silicon substrate 210. Subsequently, a copper interconnect 212 is formed on the multilayered film 211. And, a periphery of the copper interconnect 212 is made to coat with an interlayer insulating film 214 made of SiON or the like. And, a via hole 222 is provided while carrying out patterning of the interlayer insulating film 214, to expose at least portion of an upper face of the copper interconnect 212.

Figure 6B:
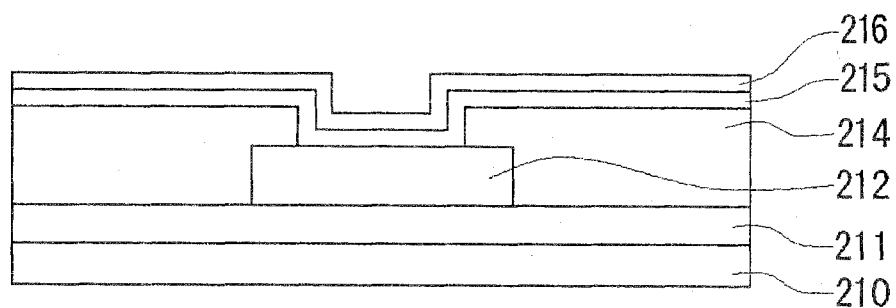

Next, as shown in FIG. 6B, the TiN film 215 and a hard mask 216 made of SiON or the like are formed in this order, in such a way as to coat the exposed upper face of the copper interconnect 212 and the upper face of the interlayer insulating film 214 made of SiON and the like.

Figure 6C:
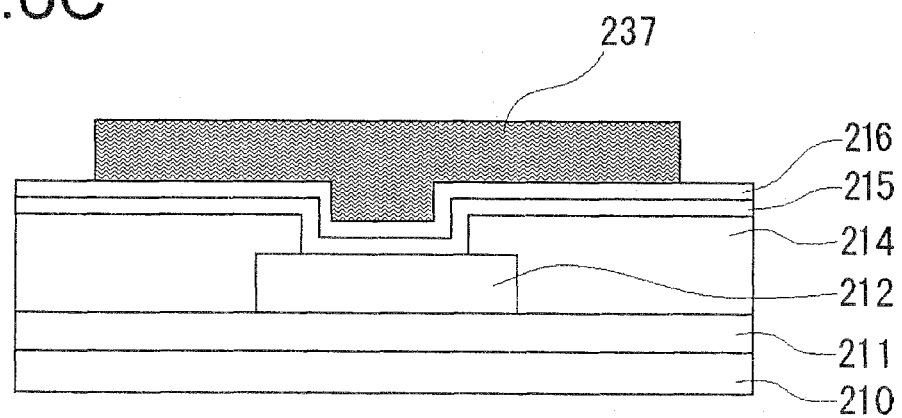

Successively, as shown in FIG. 6C, a photoresist film 237 is formed on portion of an upper face of the hard mask made of SiON or the like with a shape so as to fill the via hole 222.

Figure 7D:
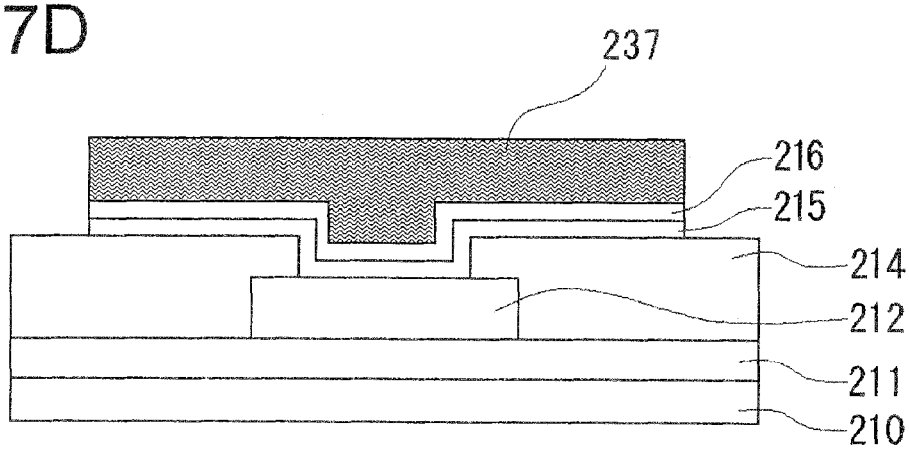
FIGS. 7D to 7F are process sectional views schematically showing a method for manufacturing the electrode pad structure according to the second embodiment.

And, as shown in FIG. 7D, the TiN film 215 and a hard mask 216 composed of the TiN film 215 and SiON and the like are patterned with a method such as an etching or the like, while employing a photoresist film 237 as a mask, and employing gas including Cl$_2$ and BCl$_2$ as an etching gas.

Figure 7E:
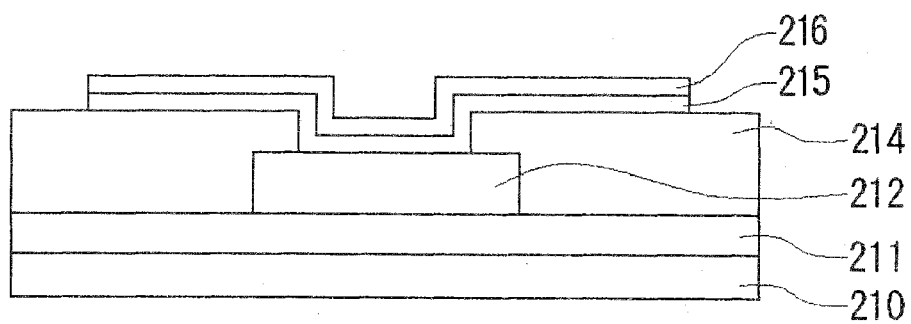

Next, as shown in FIG. 7E, the photoresist film 237 is removed while employing the oxygen plasma as an ashing gas.

Here, the hard mask 216 made of SiON or the like provided on an upper face of the TiN film 215 is made of material, which causes the oxygen plasma to hardly take place infiltrating than the TiN film 215. For this reason, a diffusion of the radical oxygen is suppressed with the hard mask 216 made of SiON or the like.

As a result, a quantity of the radical oxygen, which infiltrates up to a surface of the copper interconnect 212, decreases, so that oxidization is suppressed on the upper face of the copper interconnect 212. For this reason, good contact property between the surface of the copper interconnect 212 and the TiN film 215 is maintained.

Figure 7F:
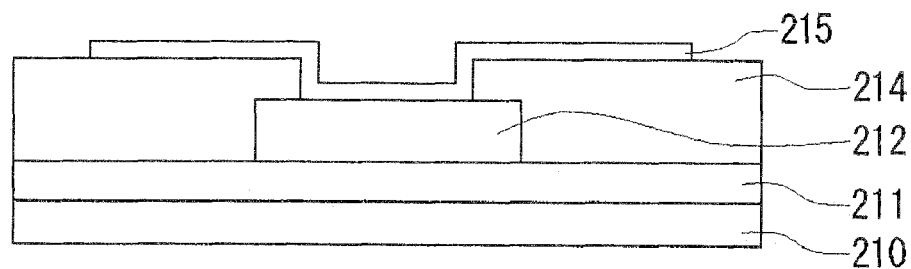

And, as shown in FIG. 7F, the hard mask 216 made of SiON or the like provided on an upper face of the Tin film 215 is removed with a method such as the etching.

Figure 8G:
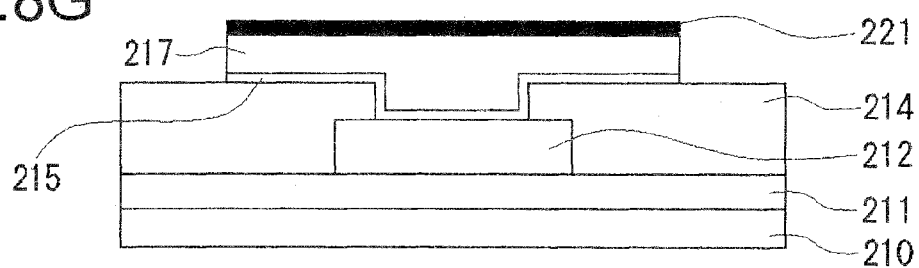

Successively, as shown in FIG. 8G, a pad metal film 217, and a TiN film 221 are formed on an upper face of the TiN film 215 in this order.

Figure 8H:
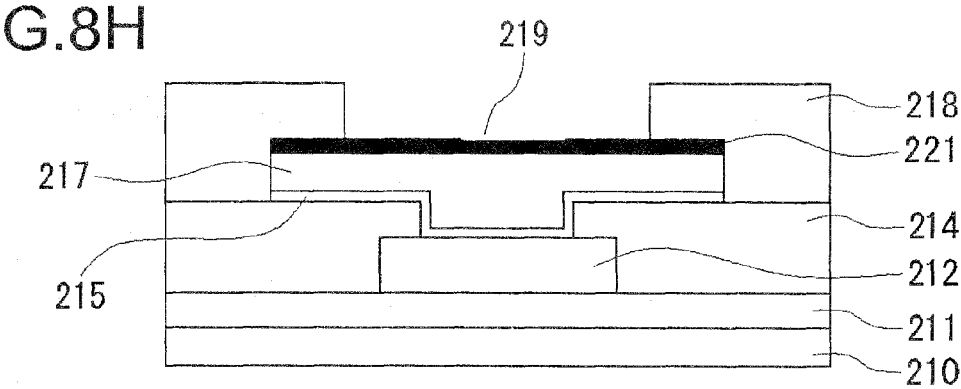

And, as shown in FIG. 8H, a periphery of the TiN film 215, the pad metal film 217 and the TiN film 218 is coated with a polyimide film 218. Further, at least portion of an upper face of the TiN film 221 is made to expose while providing an opening 219 to carry out patterning of the polyimide film 218.

Figure 8I:
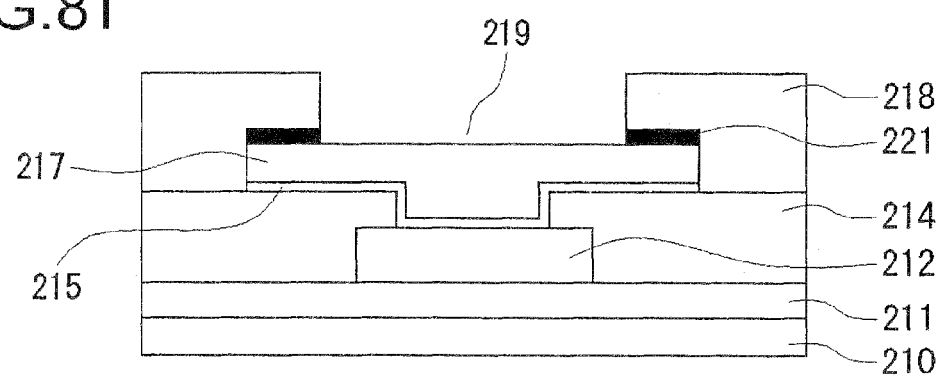

Next, as shown in FIG. 8I, a portion of an upper face of the pad metal film 217 is made to expose while carrying out patterning of the exposed portion of the TiN film 221 with a method such as etching or the like.

Figure 8J:
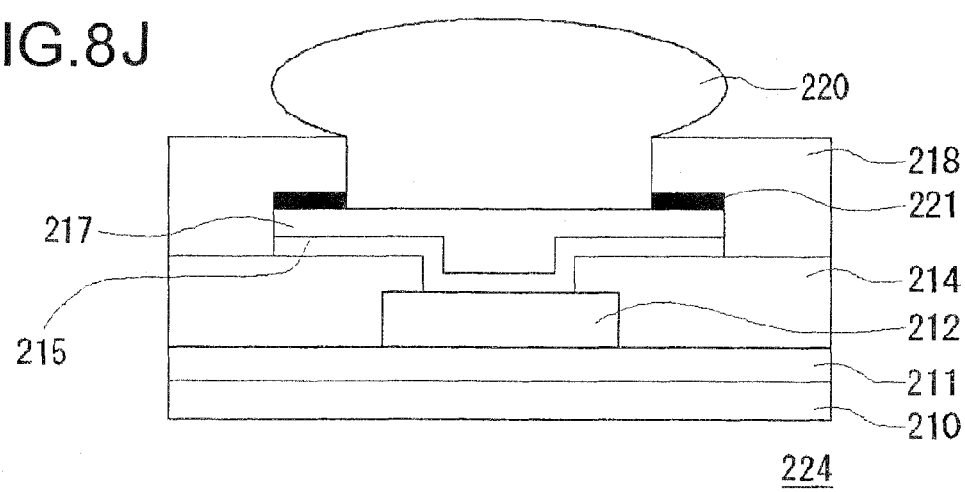

Successively, as shown in FIG. 8J, a pad electrode structure 224 as described above is obtained, while forming a solder ball in such a way as to connect to the exposed portion of the pad metal film 217.

According to the method, a diffusion of the radical oxygen is suppressed with a hard mask 216 made of SiON or the like, therefore, a quantity of the radical oxygen, which infiltrates up to a surface of the copper interconnect 212, decreases, so that oxidization on the upper face of the copper interconnect 212 is suppressed. For that reason, excellent contact property between the surface of the copper interconnect 212 and the TiN film 215 is maintained, thus it is possible to provide a BGA structure with the excellent contact property.

SECOND COMPARISON EXAMPLE

FIGS. 14A to 14C, 15D to 15F and 16G to 16I are process sectional views schematically showing a method for manufacturing the electrode pad structure according to the present comparison example.

Figure 14A:
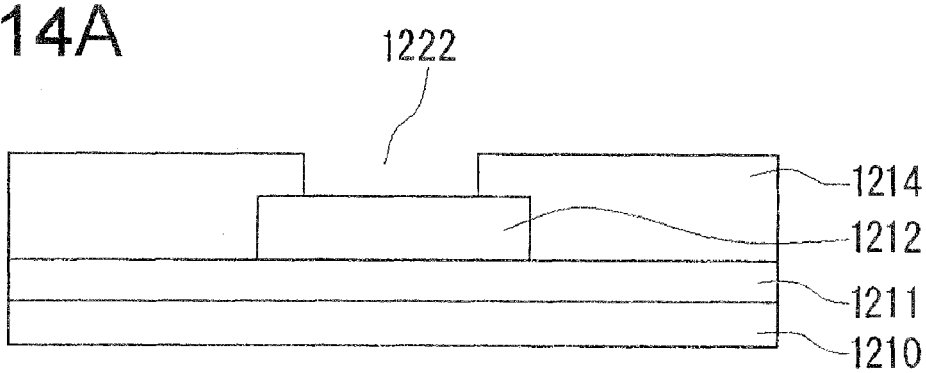
FIGS. 14A to 14C are process sectional views schematically showing a method for manufacturing the electrode pad structure according to a second comparison example.

The inventor has made up of the electrode pad structure to evaluate, employed with a manufacturing method without providing a hard mask composed of SiON film or the like on a barrier metal film composed of the TiN film described above, described as follows:

In the manufacturing method of the present comparison example, first, as shown in FIG. 14A, on a silicon semiconductor substrate 1210, a multilayered film 1211 provided with a multilayered interconnect structure is formed. Subsequently, on the multilayer film 1211, a copper interconnect 1212 is formed. And, a periphery of the copper interconnect 1212 is coated with an interlayer insulating film 1214. And, at least portion of an upper face of the copper interconnect 1212 is made to expose, while providing a via hole 1222 to carry out patterning of the interlayer insulating film 1214.

Figure 14B:
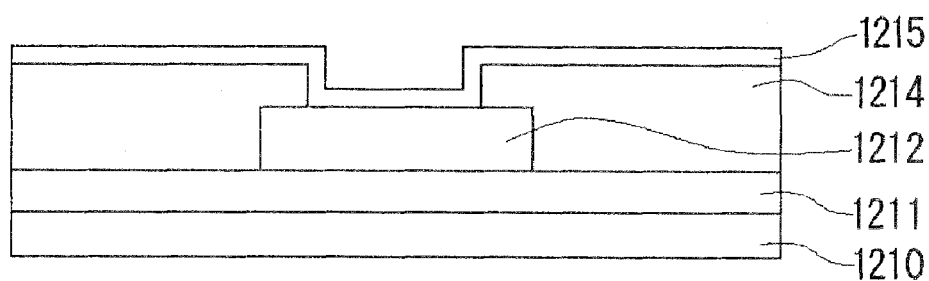

Subsequently, as shown in FIG. 14B, a TiN film 1215 is formed so as to coat the exposed upper face of the copper interconnect 1212 and the upper face of the interlayer insulating film 1214.

Figure 14C:
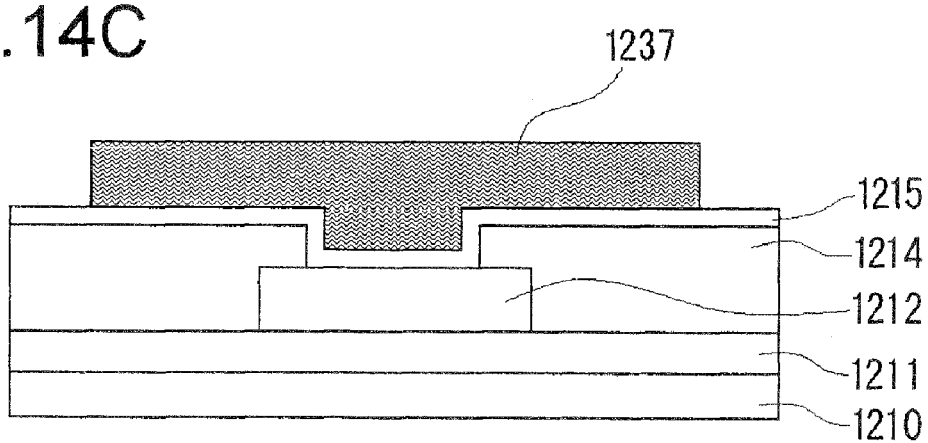

Successively, as shown in FIG. 14C, a photoresist film 1237 is formed on a portion of an upper face of the TiN film 1215 in such a shape so as to fill the via hole 1222.

Figure 15D:
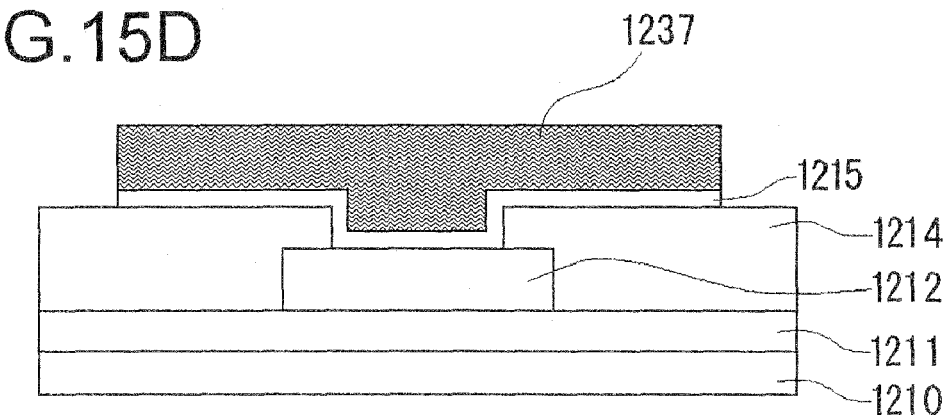
FIGS. 15D to 15F are process sectional views schematically showing a method for manufacturing the electrode pad structure according to the second comparison example.

And, as shown in FIG. 15D, the TiN film 1215 is patterned in such a method as an etching or the like, while employing a resist film 1237 as a mask.

Figure 15E:
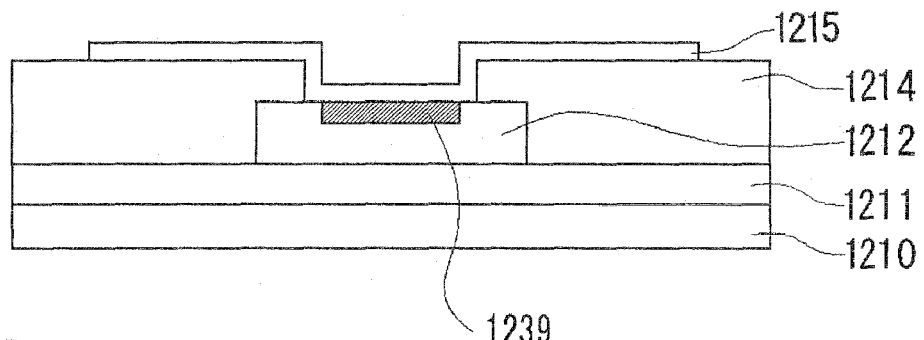

Next, as shown in FIG. 15E, the photoresist film 1237 is removed while employing the oxygen plasma or the like as an etching gas.

Figure 15F:
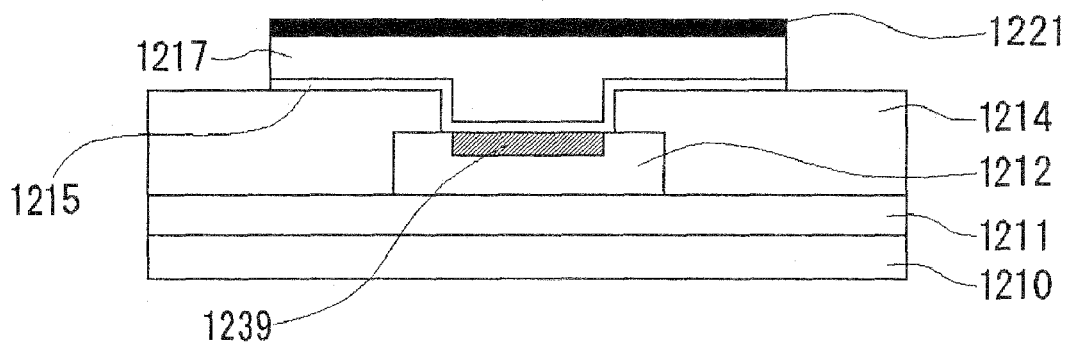

Successively, as shown in FIG. 15F, on an upper face of the TiN film 1215, a pad metal film 1217 and a TiN film 1221 are formed in this order.

And, as shown in FIG. 16G, peripheries of the TiN film 1215, the pad metal film 1217 and the TiN film 1221 are coated with a polyimide film 1218. Further, at least portion of an upper face of the TiN film 1221 is made to expose, while providing an opening 1219 to carry out patterning of the polyimide film 1218.

Next, as shown in FIG. 16H, a portion of an upper face of the pad metal film 1217 is made to expose, while carrying out patterning of the exposed portion of the TiN film 1221 in such a method as an etching or the like.

Successively, as shown in FIG. 16I, a solder ball 1220 is formed, in such a way as to connect to the exposed portion of the pad metal film 1217.

In the present comparison example, different from the embodiment case, since there is no a hard cover film such as a SiON film or the like on the TiN film 1215, on the occasion of removing the photoresist film 1237. In removing the photoresist film 1237, the oxygen plasma or the like is employed as an etching gas. At this time, the TiN film 1215 is made of material causing the oxygen plasma to relatively infiltrate easily. For that reason, the radical oxygen, which infiltrates the TiN film 1215, infiltrates up to a surface of the copper interconnect 1212; it contributes to generate an oxidized region 1239 where copper is oxidized.

And, when copper is oxidized, cubical expansion takes place, therefore, it contributes to decrease contact property between the oxidized region 1239 of the surface of the copper interconnect 1212 and the TiN film 1215.

Third Embodiment

Figure 9A:
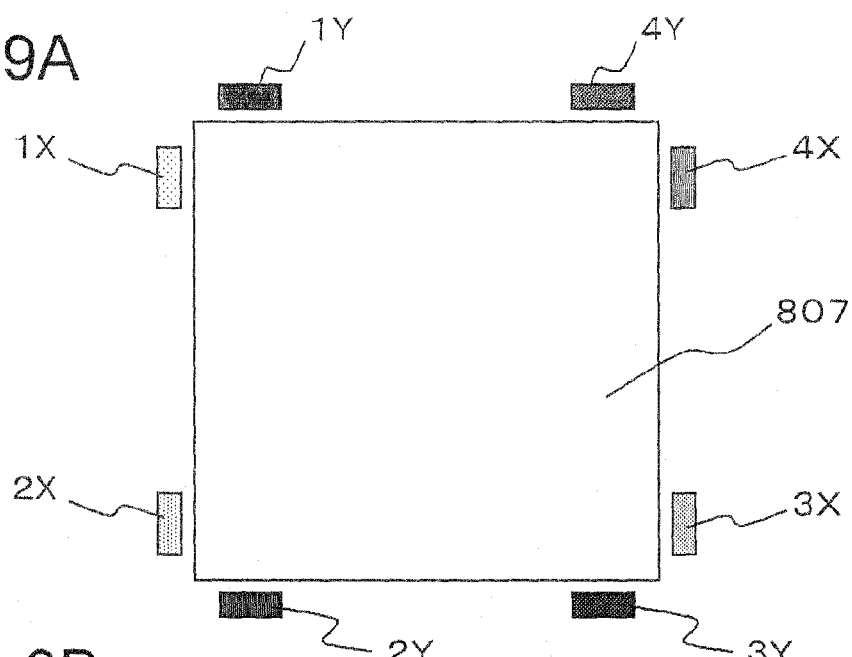
FIGS. 9A to 9C are plan views and a sectional view schematically showing a contrast evaluation method of alignment mark according to the embodiment.
Figure 9B:
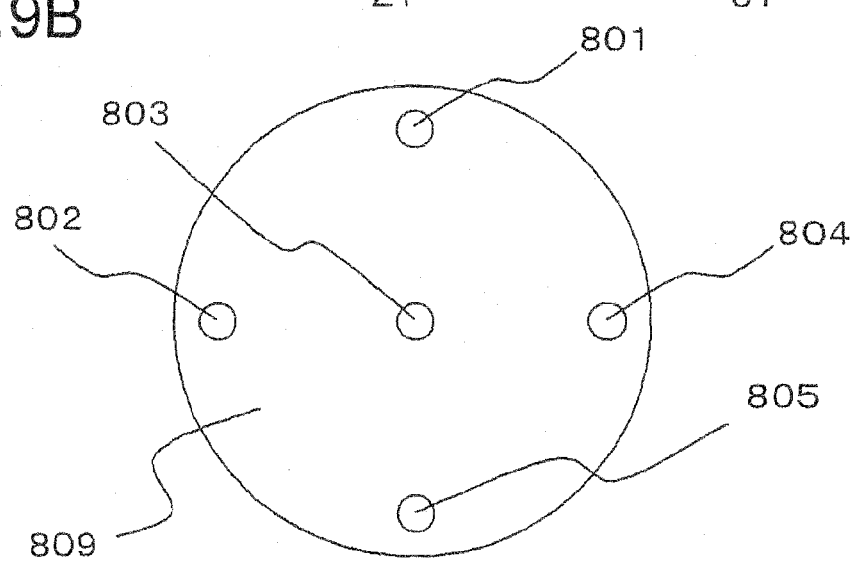
Figure 9C:
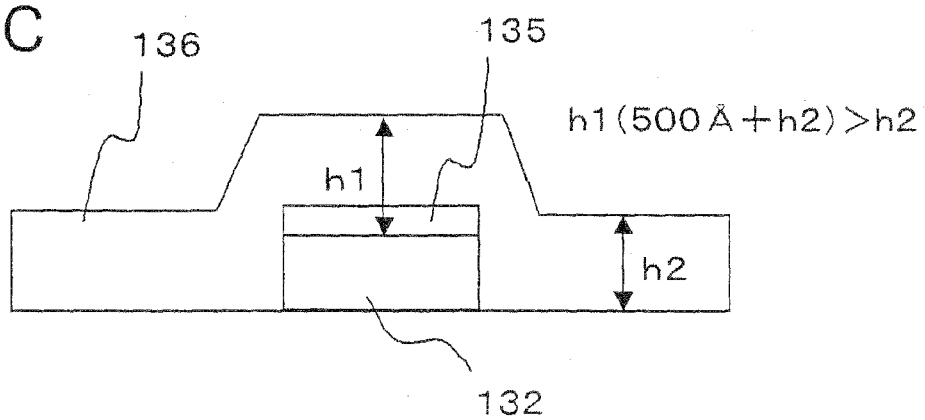

FIGS. 9A to 9C are plan views and a sectional view schematically showing a contrast evaluation method of an alignment mark according to the embodiment.

In order to evaluate alignment property of the fuse electrode according to the present embodiment, as shown in FIG. 9A, the respective fuse structures according to the present embodiment described above are provided as X coordinate alignment marks 1X, 2X, 3X and 4X, and Y coordinate alignment marks 1Y, 2Y, 3Y and 4Y in the periphery of a semiconductor chip 807.

It should be noted that, as shown in FIG. 9B, in order to reduce a measurement error, in measurement positions 801, 802, 803, 804 and 805 to be five different measurement points on the same semiconductor wafer 809, alignment property of the alignment mark of the semiconductor chip is evaluated.

As shown in FIG. 9C, each alignment mark has a structure that a TiN film 132 is provided on an upper portion of a fuse electrode (not shown in the drawings) composed of the copper containing metal film provided on an inside of a recess portion on surface of an upper portion of an insulating film; and a SiON film 135 is provided on an upper portion of the TiN film 132, further, an SiON film 136 is provided on an upper portion of its insulating film (not shown in the drawings) and SiON film 135. Here, a thickness of a cover insulating film (sum of thickness of SiON film 135 and SiON film 136) h1 in an alignment region is made larger than a thickness of a cover insulating film h2 in a nonalignment region. Specifically, h1 is made larger than h2 in 500 Å. That is, a thickness of SiON film is made 500 Å.

Measurement of the contrast has been carried out about each alignment mark made in this way. The contrast of each alignment mark is obtained in such a method that reflected light is measured upon irradiating predetermined wavelength light from above to measure a difference of an index reflection.

FIG. 10 is a graphical representation showing a contrast evaluation result of the alignment mark according to the present embodiment. A horizontal axis indicates measurement points, and a longitudinal axis indicates a contrast value.

Thus, a contrast value of the alignment mark according to the present embodiment has a degree of about 0.15, so that the contrast value has reached the reference of about not less than 0.15 to be a contrast value to become the target, which is required to manufacture a semiconductor element having an excellent quality with an excellent manufacturing stability.

For that reason, when manufacturing a semiconductor device provided with a fuse structure by a method for manufacturing a fuse structure according to the present embodiment described above, in the manufacturing process of the semiconductor device, it becomes easy to disconnect a fuse accurately.

Consequently, in recent years, a fuse electrode composed of a copper containing metal film becomes employed instead of a fuse electrode composed of a conventional aluminum containing metal film, so, in the case of manufacturing a semiconductor device provided with a fuse structure on the basis of a method for manufacturing a fuse structure according to the present embodiment, the above described contrast value becomes excellent, thus it is possible to realize excellent alignment property.

That is, a multilayered structure of the TiN film 132, the SiON film 135 and the SiON film 136 provided for the fuse structure according to the present embodiment, is capable of being employed as an excellent alignment mark. Accordingly, the fuse structure according to the present embodiment is excellent in the alignment property, and has an advantage that a correct fuse is easily cut with lasers.

THIRD COMPARISON EXAMPLE

Figure 17A:
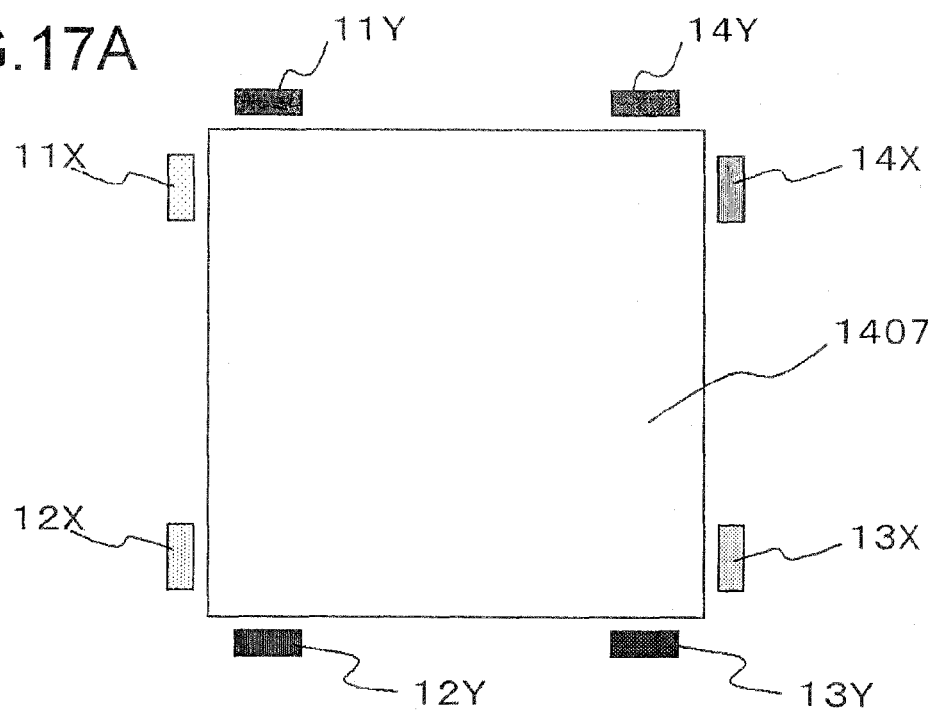
FIGS. 17A to 17C are plan views and a sectional view schematically showing the contrast evaluation method of the alignment mark according to a third comparison example.
Figure 17B:
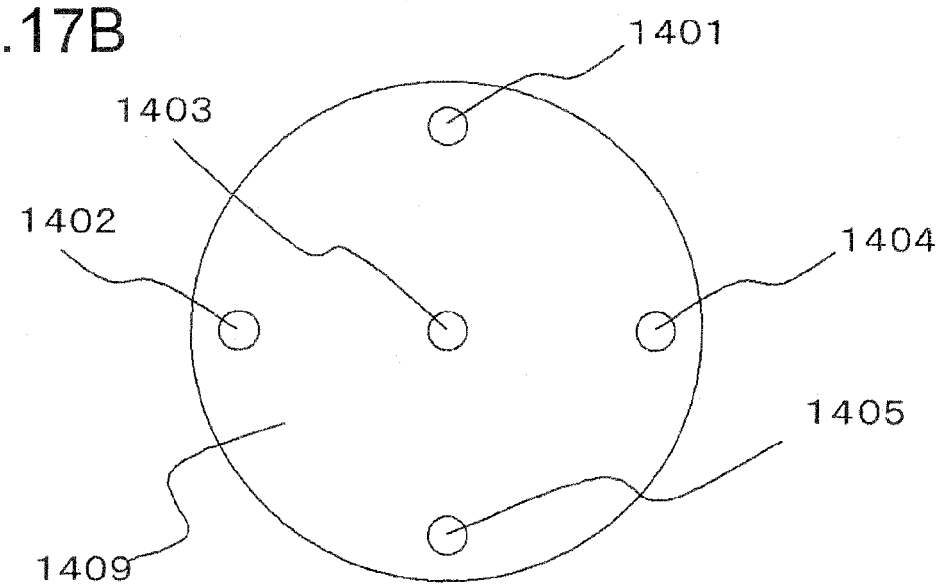
Figure 17C:
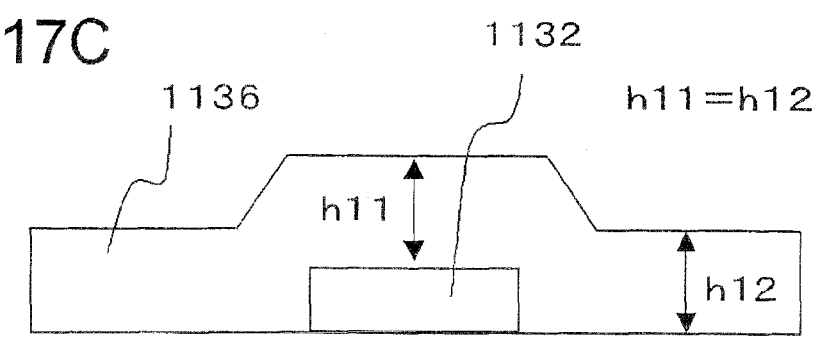

FIGS. 17A to 17C are plan views and a sectional view schematically showing a contrast evaluation method of an alignment mark according to the present comparison example.

The inventor has made up of a fuse structure to evaluate, provided with a structure without providing a hard cover film composed of the SiON film on a fuse wiring composed of the TiN film as follows:

In order to evaluate alignment property of the fuse electrode according to the present comparison example, as shown in FIG. 17A, the respective fuse structures according to the present comparison example described above are provided as X coordinate alignment marks 11X, 12X, 13X and 14X, and Y coordinate alignment marks 11Y, 12Y, 13Y and 14Y in the periphery of a semiconductor chip 1407.

It should be noted that, as shown in FIG. 17B, in order to reduce a measurement error, in measurement positions 1401, 1402, 1403, 1404 and 1405 to be five different measurement points on the same semiconductor wafer 1409, alignment property of the alignment mark of the semiconductor chip is evaluated.

As shown in FIG. 17C, each alignment mark has a structure that a TiN film 1132 is provided on an upper portion of a fuse electrode (not shown in the drawings) composed of the copper containing metal film provided on an inside portion of a recess portion on a surface of an upper portion of an insulating film (not shown in the drawings); further, an SiON film 1136 is provided on an upper portion of its insulating film (not shown in the drawings) and the TiN film 1132. Here, a thickness of a cover insulating film h11 in an alignment region is as same as a thickness of a cover insulating film h12 in a non-alignment region.

About each alignment mark produced in this way, a measurement of the contrast has been carried out. The contrast of each alignment mark is obtained in such a method that reflected light is measured upon irradiating predetermined wavelength light from above to measure a difference of the index reflection.

Figure 18:
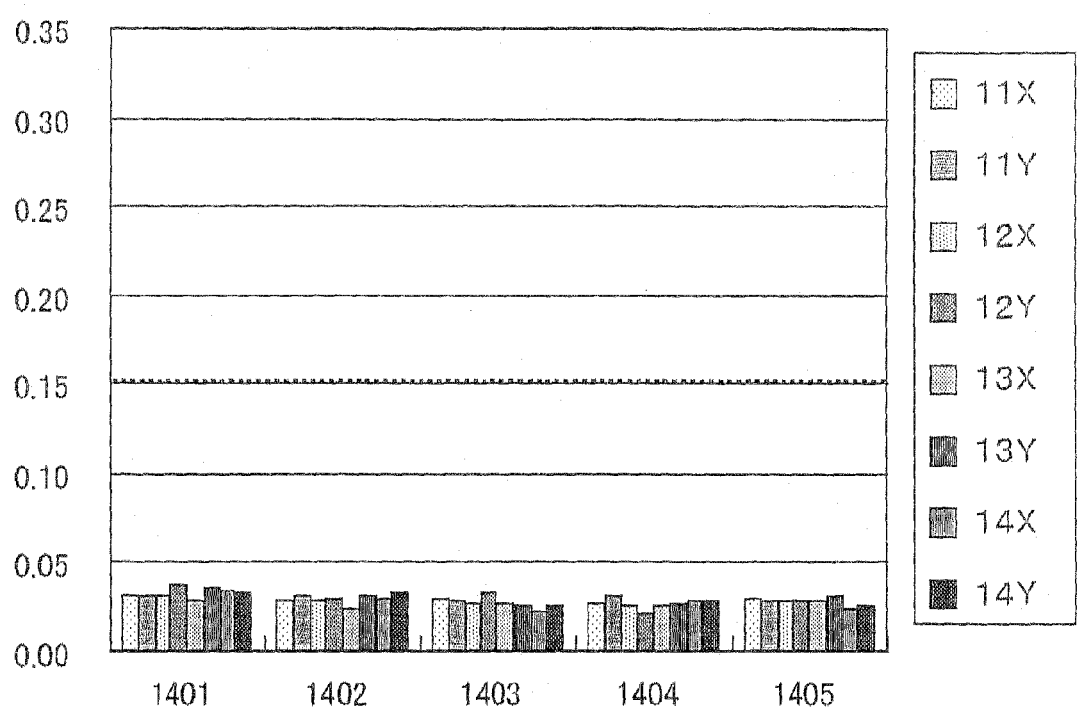
FIG. 18 is a graphical representation showing a contrast evaluation result of the alignment mark according to the third comparison example.

FIG. 18 is a graphical representation showing a contrast evaluation result of the alignment mark according to the comparison example. A horizontal axis indicates measurement points, and a longitudinal axis indicates contrast value.

Thus, in the present comparison example, different from the embodiment, one more layer of SiON film is not provided on a TiN film, therefore, a contrast value of the alignment mark according to the comparison example is about 0.03, so that the contrast value has not reached the reference of about not less than 0.15 to be a contrast value to become the target, which is required to manufacture a semiconductor element having an excellent quality with excellent manufacturing stability.

For that reason, when manufacturing the semiconductor device composed of the fuse structure by a method for manufacturing the fuse electrode according to the present comparison example described above, this contributes to a state where it becomes difficult to accurately cut a fuse.

Conventionally, an aluminum containing metal film excellent in alignment property was used as a material of the fuse electrode, for that reason, the alignment property was relatively excellent, even though fuse electrodes composed of the structure described above are used as alignment marks.

On the other hand, in recent years, fuse electrodes composed of a copper containing metal film become employed instead of fuse electrodes composed of a conventional aluminum containing metal film, accordingly, an alignment property deterioration caused by the above described contrast value lowering becomes remarkable.

For that reason, as the present comparison example, in a case that a fuse electrode composed of a copper containing metal film is provided on a lower portion, it becomes apparent that a contrast value of an alignment mark is insufficient.

As described above, the present invention has explained based on the embodiment. Strictly, the embodiment is illustration only, and various modified examples are possible, thus, those skilled in the art may understand that such modified examples fall within the scope of the present invention.

It is apparent that the present invention is not limited to the above embodiment that modified and changed without departing from the scope and spirit of the invention.

What is claimed is:

1. A method for manufacturing a semiconductor device comprising:

forming a first insulating film on a semiconductor substrate;

embedding a copper containing metal film in said first insulating film;

forming a refractory metal containing film covering an upper face of said first insulating film and an upper face of said copper containing metal film;

forming a second insulating film covering an upper face of said refractory metal containing film;

forming a resist film on an upper face of said second insulating film, etching selectively said second insulating film and said refractory metal containing film while employing said resist film as a mask, and carrying out a patterning into a shape to cover an upper portion of said copper containing metal film and an upper portion of a boundary portion between said copper containing metal film and said first insulating film; and removing said resist film while employing an oxygen plasma.

2. A method for manufacturing a semiconductor device comprising:

forming a first insulating film on a semiconductor substrate;

embedding a copper containing metal film in said first insulating film;

forming a refractory metal containing film covering an upper face of said first insulating film and an upper face of said copper containing metal film;

forming a second insulating film covering an upper face of said refractory metal containing film; and forming a resist film on an upper face of said second insulating film, etching selectively said second insulating film while employing said resist film as a mask, removing said resist film while employing an oxygen plasma, etching selectively said refractory metal containing film while employing said second insulating film as a mask, and carrying out a patterning into a shape to cover an upper portion of said copper containing metal film and an upper portion of a boundary portion between said copper containing metal film and said first insulating film in connection with said second insulating film and said refractory metal containing film.

3. A method for manufacturing a semiconductor device comprising:
   forming a first insulating film on a semiconductor substrate;
   embedding a copper containing metal film in said first insulating film;
   forming a refractory metal containing film covering an upper face of said first insulating film and an upper face of said copper containing metal film;
   forming a second insulating film covering an upper face of said refractory metal containing film;
   forming a resist film on an upper face of said second insulating film, etching selectively said second insulating film and said refractory metal containing film while employing said resist film as a mask, and carrying out a patterning into a shape to cover an upper portion of said copper containing metal film and an upper portion of a boundary portion between said copper containing metal film and said first insulating film;
   removing said resist film while employing an oxygen plasma;
   removing said second insulating film; and
   forming an electrode pad on an upper face of said refractory metal containing film.

4. The method for manufacturing a semiconductor device according to claim 3, further comprising: forming a solder ball on an upper face of said electrode pad.

5. The method for manufacturing a semiconductor device according to claim 1, wherein said forming said second insulating film includes forming said second insulating film by plasma technique or CVD technique.

6. The method for manufacturing a semiconductor device according to claim 2, wherein said forming said second insulating film includes forming said second insulating film by plasma technique or CVD technique.

7. The method for manufacturing a semiconductor device according to claim 3, wherein said forming said second insulating film includes forming said second insulating film by plasma technique or CVD technique.

* * * * *